United States Patent
Kito et al.

(10) Patent No.: US 10,683,185 B2
(45) Date of Patent: Jun. 16, 2020

(54) PROCESSING SYSTEM AND DEVICE MANUFACTURING METHOD

(71) Applicant: NIKON CORPORATION, Tokyo (JP)

(72) Inventors: Yoshiaki Kito, Kamakura (JP); Masaki Kato, Yokohama (JP); Kei Nara, Yokohama (JP); Masakazu Hori, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/276,102

(22) Filed: Feb. 14, 2019

(65) Prior Publication Data

US 2019/0177105 A1 Jun. 13, 2019

Related U.S. Application Data

(62) Division of application No. 15/508,358, filed as application No. PCT/JP2015/075032 on Sep. 3, 2015, now Pat. No. 10,246,287.

(30) Foreign Application Priority Data

Sep. 4, 2014 (JP) ................................ 2014-179887

(51) Int. Cl.
*B65H 20/34* (2006.01)
*B65H 20/02* (2006.01)
(Continued)

(52) U.S. Cl.
CPC ........... *B65H 20/34* (2013.01); *B65H 18/103* (2013.01); *B65H 20/02* (2013.01); *B65H 20/24* (2013.01);
(Continued)

(58) Field of Classification Search
None
See application file for complete search history.

(56) References Cited

U.S. PATENT DOCUMENTS 10,246,287 B2 * 4/2019 Kito ..................... B65H 18/103
2009/0154790 A1 6/2009 Narabayashi
(Continued)

FOREIGN PATENT DOCUMENTS

CN 102169826 A 8/2011
JP 2006-098725 A 4/2006
(Continued)

OTHER PUBLICATIONS

Mar. 13, 2019 Office Action issued in Chinese Patent Application No. 201580047663.1.
(Continued)

*Primary Examiner* — William B Perkey
(74) *Attorney, Agent, or Firm* — Oliff PLC

(57) ABSTRACT

A processing system and a device manufacturing method that can perform manufacturing of an electronic device without stopping the entire manufacturing system, even when the processing state actually implemented on a sheet substrate by a processing device differs from the target processing state. A processing system for sequentially conveying a long, flexible sheet substrate along a length direction to each of a first through a third processing device to form a predetermined pattern on the sheet substrate, wherein the first through the third processing devices implement a predetermined process relating to the sheet substrate according to setting conditions set to each processing device, and when at least one from among the states of the actual processing implemented on the sheet substrate by each of the first through the third processing devices exhibits a processing error relative to a target processing state, changes other setting conditions, separate from the setting conditions exhibiting the processing error, according to the processing error.

14 Claims, 13 Drawing Sheets

(51) Int. Cl.
  *B65H 20/24* (2006.01)
  *B65H 18/10* (2006.01)
  *B65H 23/188* (2006.01)
  *G03F 7/16* (2006.01)
  *G03F 7/24* (2006.01)
  *G03F 9/00* (2006.01)
  *G03F 7/30* (2006.01)
  *H01L 21/677* (2006.01)
  *H01L 21/67* (2006.01)

(52) U.S. Cl.
  CPC ........... *B65H 23/1888* (2013.01); *G03F 7/16* (2013.01); *G03F 7/24* (2013.01); *G03F 7/3042* (2013.01); *G03F 7/3064* (2013.01); *G03F 7/3071* (2013.01); *G03F 9/00* (2013.01); *H01L 21/677* (2013.01); *H01L 21/67173* (2013.01); *H01L 21/67288* (2013.01); *B65H 2511/112* (2013.01); *B65H 2801/61* (2013.01)

(56) References Cited

U.S. PATENT DOCUMENTS

| 2011/0200923 A1 | 8/2011 | Niwa et al. |
| 2014/0008426 A1 | 1/2014 | Fisher et al. |
| 2017/0253451 A1 | 9/2017 | Kito et al. |

FOREIGN PATENT DOCUMENTS

| JP | 2015-018006 A | 1/2015 |
| TW | 201337471 A | 9/2013 |
| WO | 2007/138798 A1 | 12/2007 |
| WO | 2013/035696 A1 | 3/2013 |
| WO | 2013/065429 A1 | 5/2013 |
| WO | 2013/136834 A1 | 9/2013 |

OTHER PUBLICATIONS

Mar. 13, 2019 Office Action issued in Chinese Patent Application No. 201810480108.3.
Nov. 24, 2015 International Search Report issued in International Patent Application No. PCT/JP2015/075032.
Nov. 24, 2015 Written Opinion issued in International Patent Application No. PCT/JP2015/075032.
Jan. 2, 2018 Office Action issued in Chinese Patent Application No. 201580047663.1.
Jan. 2, 2018 Search Report issued in Chinese Patent Application No. 201580047663.1.
Oct. 29, 2018 Office Action issued in Chinese Patent Application No. 201580047663.1.

\* cited by examiner

PROCESSING SYSTEM AND DEVICE MANUFACTURING METHOD

RELATED APPLICATIONS

The present application is a divisional application of U.S. application Ser. No. 15/508,358 filed May 19, 2017, which in turn is a U.S. national stage application of PCT/JP2015/075032 filed Sep. 3, 2015. The entire disclosure of each of these prior applications is incorporated herein by reference.

TECHNICAL FIELD

The present invention relates to a processing system and a device manufacturing method for manufacturing electronic devices via a roll-to-roll method.

BACKGROUND ART

In WO 2013/136834, a roll-to-roll method manufacturing system is known, wherein a sheet substrate, supplied from a supply roll on which a sheet substrate is wound, is conveyed along a length direction; then, after predetermined processing is implemented on the sheet substrate via a plurality of processing devices U1 to Un lined up along the length direction, it is wound up on a collection roll, in order to form a pattern of an electronic device (organic EL or a liquid crystal display panel) on a flexible long sheet substrate. Specifically, the processing device U1 forms a photosensitive functional layer on the surface of the sheet substrate, relating to the flexible sheet substrate pulled out from the supply roll; the processing device U2 stably fixes the formed photosensitive functional layer by heating the sheet substrate. Then, the processing device U3 (exposure device) irradiates ultraviolet patterning light on the photosensitive functional layer; the processing device U4 performs developing; the processing device U5 dries the sheet substrate by warming.

However, in a roll-to-roll method manufacturing system such as that of WO 2013/136834, when the state of the processing actually implemented on the sheet substrate by one of the processing devices U differs from the target processing state, for example, when the strength of the illumination light for exposure (laser light or the like) of the processing device U3 (exposure device) is not at the target strength, or the like, the pattern formed on the sheet substrate is not the desired pattern. Because the pattern formed on this sheet substrate is formed by the processes of each processing device U1 to Un, it is impossible to ascertain which processing device is the cause by simply looking at the formed pattern. Furthermore, in a roll-to-roll method manufacturing system, because one long sheet substrate connected in a belt shape is continuously conveyed in the length direction, when the processing device generating the processing error is ascertained, due to the necessity of adjustment work and the like for keeping the processing error within a permissible range, even temporarily stopping the processing operation of the ascertained processing device means stopping the entire manufacturing system (one continuous manufacturing line), which is inefficient.

SUMMARY OF INVENTION

A first aspect of the present invention is a processing system for sequentially conveying a long, flexible sheet substrate along a length direction to each of a plurality of processing devices to form a predetermined pattern on the sheet substrate, provided with: a first processing device for conveying the sheet substrate in the length direction according to first setting conditions while selectively or uniformly forming a photosensitive thin film on the surface of the sheet substrate; a second processing device for conveying the sheet substrate in the length direction according to second setting conditions while irradiating the photosensitive thin film on the surface of the sheet substrate with light energy corresponding to the pattern to form a latent image on the photosensitive thin film corresponding to the pattern; a third processing device for conveying the sheet substrate in the length direction according to third setting conditions while causing the pattern to appear on the sheet substrate via selective development of the photosensitive thin film corresponding to the latent image or via selective plating on the photosensitive thin film corresponding to the latent image; and a control device, which, when at least one from among the states of the actual processing implemented on the sheet substrate by each of the first through the third processing devices exhibits a processing error relative to a target processing state of each of the first through the third processing devices, changes other setting conditions, separate from the setting conditions exhibiting the processing error from among the first through the third setting conditions, according to the processing error.

A second aspect of the present invention is a processing system for sequentially conveying a long, flexible sheet substrate along a length direction to each of a plurality of processing devices to form a predetermined conductive pattern on the sheet substrate, provided with: a first processing device for conveying the sheet substrate in the length direction according to first setting conditions while selectively or uniformly forming a predetermined coating layer on the surface of the sheet substrate; a second processing device for conveying the sheet substrate in the length direction according to second setting conditions while irradiating the coating layer on the surface of the sheet substrate with light energy corresponding to the pattern to form a reformed portion on the coating layer corresponding to the pattern; a third processing device for conveying the sheet substrate in the length direction according to third setting conditions while forming the pattern by precipitating a conductive material on one of either the reformed portion or the non-reformed portion by performing plating; and a control device, which, when at least one from among the states of the actual processing implemented on the sheet substrate by each of the first through the third processing devices exhibits a processing error relative to a target processing state of each of the first through the third processing devices, changes other setting conditions, separate from the setting conditions exhibiting the processing error from among the first through the third setting conditions, according to the processing error.

A third aspect of the present invention is a processing system for sequentially conveying a long, flexible sheet substrate along a length direction to each of a plurality of processing devices to form a predetermined conductive pattern on the sheet substrate, provided with: a first information forming device, provided on a first processing device from among the plurality of processing devices, for forming a first information relating to the processing state implemented on the sheet substrate according to the first setting conditions by the first processing device, or relating to processing error, on a part of the sheet substrate; a second information forming device, provided on a second processing device that is downstream from the first processing device, for forming a second information relating to the processing state implemented on the sheet substrate according to the second setting conditions by the second processing device or relating to processing error, on a part of the sheet substrate; an information gathering device, provided on the conveyance path of the sheet substrate, for reading the first information or the second information formed on the sheet substrate and gathering the first information or the second information, and a control device for correcting the second setting conditions as necessary based on the first information read from the information gathering device, and correcting the first setting conditions as necessary based on the second information read from the information gathering device.

A fourth aspect of the present invention is a device manufacturing method for conveying a long, flexible sheet substrate along a length direction while forming a pattern for an electronic device on the sheet substrate, including: conveying the sheet substrate through a first processing step, a second processing step, and a third processing step, in that order, to implement mutually differing processes relating to the sheet substrate; depositing a coating layer selectively or uniformly on the surface of the sheet substrate under first processing conditions set to the first processing step; creating a reformed portion corresponding to the pattern on the coating layer by irradiating energy lines corresponding to the pattern on the coating layer, under second processing conditions set to the second processing step; causing the pattern to appear on the sheet substrate by implementing processing for removing one of either the reformed portions or the non-reformed portions of the coating layer, or processing for precipitating a material for electronic devices on one of either the reformed portions or the non-reformed portions; and determining the possibility of changing at least one of the conditions of the first processing conditions, the second processing conditions, or the third processing conditions, and the possibility of changing the conveying speed of the sheet substrate of at least one of the first processing step, the second processing step, and the third processing step, when the pattern appearing on the sheet substrate displays a tendency to fluctuate outside a permissible range relating to the target shape or dimensions.

A fifth aspect of the present invention is a device manufacturing method for conveying a long, flexible sheet substrate along a length direction while forming a pattern for an electronic device on the sheet substrate, including: a conveying step for conveying the sheet substrate through a first processing step and a second processing step, in that order, to implement mutually differing processes relating to the sheet substrate; depositing a coating layer selectively or uniformly on the surface of the sheet substrate under first processing conditions set to the first processing step; creating a reformed portion corresponding to the pattern on the coating layer under second processing conditions set to the second processing step, and causing the pattern to appear on the sheet substrate by implementing processing for removing one of either the reformed portions or the non-reformed portions of the coating layer, or processing for precipitating a material for electronic devices on one of either the reformed portions or the non-reformed portions; and determining the possibility of changing at least one of the conditions of the first processing conditions or the second processing conditions, and the possibility of changing the conveying speed of the sheet substrate of at least one of the first processing step or the second processing step, when the pattern appearing on the sheet substrate during the second processing step displays a tendency to fluctuate relating to the target shape or dimensions, according to the tendency.

A sixth aspect of the present invention is a device manufacturing method for conveying a long, flexible sheet substrate along a length direction while forming a pattern for an electronic device on the sheet substrate, including: a conveying step for conveying the sheet substrate through a first processing step and a second processing step, in that order, to implement mutually differing processes relating to the sheet substrate; depositing a coating layer selectively or uniformly on the surface of the sheet substrate and creating a reformed portion corresponding to the pattern on the coating layer by irradiating energy lines corresponding to the pattern on the coating layer under first processing conditions set to the first processing step, and causing the pattern to appear on the sheet substrate by implementing processing for removing one of either the reformed portions or the non-reformed portions of the coating layer, or processing for precipitating a material for electronic devices on one of either the reformed portions or the non-reformed portions under second processing conditions set to the second processing step; and determining the possibility of changing at least one of the conditions of the first processing conditions or the second processing conditions, and the possibility of changing the conveying speed of the sheet substrate of at least one of the first processing step or the second processing step, when the pattern appearing on the sheet substrate displays a tendency to fluctuate relating to the target shape or dimensions.

A seventh aspect of the present invention is a device manufacturing method for conveying a long, flexible sheet substrate along a length direction while forming a pattern for an electronic device on the sheet substrate, including:

a first processing step for sending the sheet substrate in the length direction at a predetermined conveyance speed while irradiating the coating layer formed on the surface of the sheet substrate with energy lines corresponding to the pattern under first setting conditions to create reformed portions and non-reformed portions on the coating layer, corresponding to the pattern; a second processing step for sending the sheet substrate that has passed through the first processing step in the length direction at a predetermined conveyance speed while causing the pattern to appear on the sheet substrate by implementing processing for removing one of either the reformed portions or the non-reformed portions of the coating layer, or processing for precipitating a material for electronic devices on one of either the reformed portions or the non-reformed portions under second processing conditions; and determining the possibility of changing at least one of the conditions of the first processing conditions or the second processing conditions, and the possibility of changing the conveying speed of the sheet substrate of at least one of the first processing step or the second processing step, when the pattern appearing on the sheet substrate displays a tendency to fluctuate outside a permissible range relating to the target shape or dimensions.

An eighth aspect of the present invention is a device manufacturing method for conveying a long, flexible sheet substrate along a length direction while forming a pattern for an electronic device on the sheet substrate, including: a conveying step for sending the sheet substrate in a length direction through a first processing device and a second processing device, in that order, to implement mutually differing processes relating to the sheet substrate;

a first processing step for implementing processing on the substrate under first processing conditions set to the first processing device; a second processing step for implementing processing on the substrate that has passed through the first processing step and causing the pattern to appear on the substrate under second processing conditions set to the second processing device; a sensing step for sensing whether the quality of the pattern that has appeared on the substrate has changed relating to the target; and a determining step for determining the possibility of changing at least one of either the first processing conditions or the second processing conditions when the quality of the pattern displays a tendency to decline.

DESCRIPTION OF EMBODIMENTS

Appropriate embodiments are provided concerning the processing system and device manufacturing method according to the modes of the present invention, and are described in detail below with reference to the attached drawings. Note that the modes of the present invention are not limited to these embodiments, but also include modes with various changes or improvements added thereto. In other words, in the constituent elements described below, components that are substantially the same, or also components that a person skilled in the art could easily conceive are included; components described below can be appropriately combined. Also, within the scope of what does not deviate from the intent of the present invention, various component omissions, substitutions, or changes are possible.

First Embodiment

Figure 1:
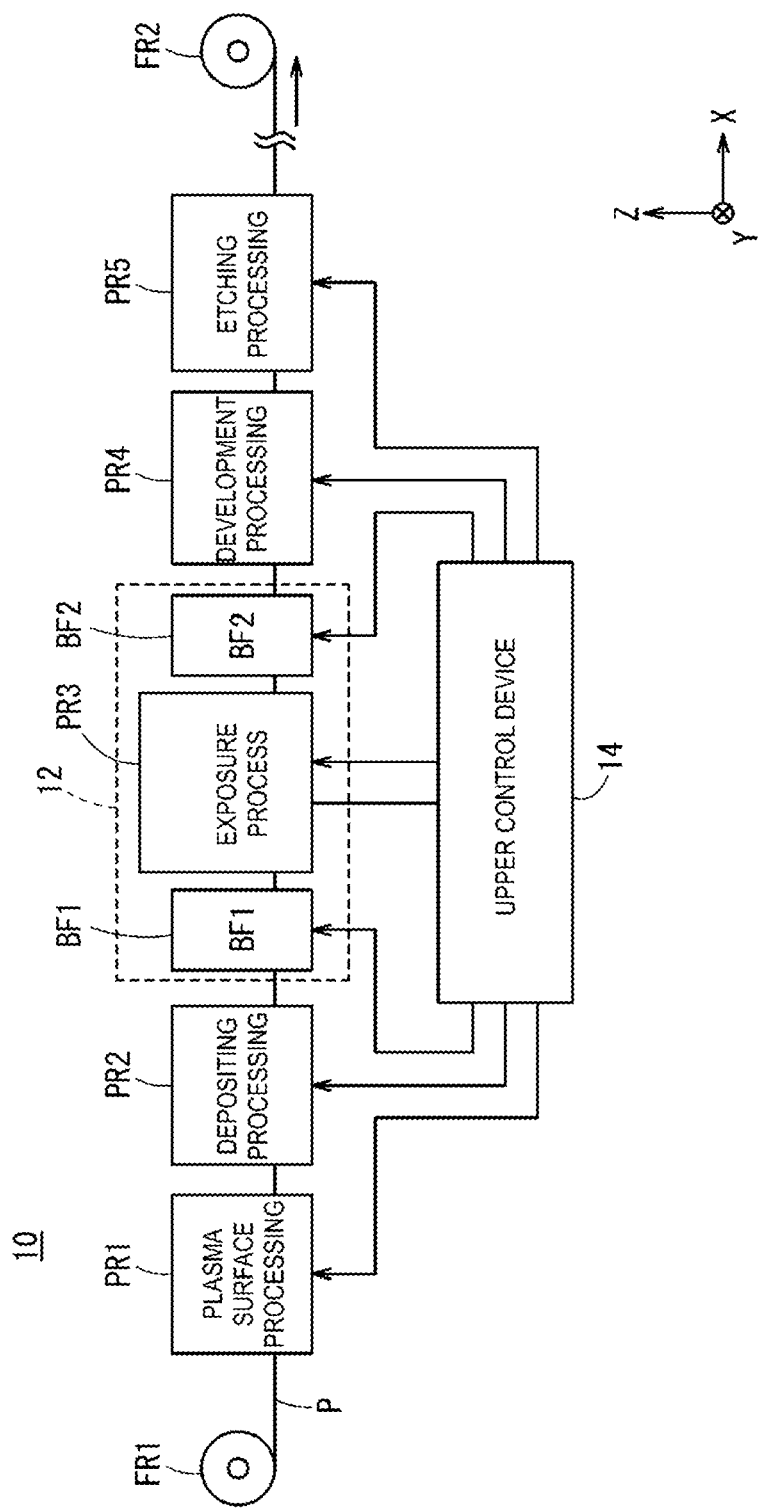
FIG. 1 is a schematic configuration view illustrating a schematic configuration of a device manufacturing system according to a first embodiment.

FIG. 1 is a schematic configuration view illustrating a schematic configuration of a device manufacturing system (processing system) 10 according to a first embodiment. The device manufacturing system 10 illustrated in FIG. 1, for example, is a line (flexible display manufacturing line) for manufacturing a flexible display as an electronic device. As a flexible display, for example, there are organic EL displays, liquid crystal displays, and the like. This device manufacturing system 10 is of a roll-to-roll method, which sends out a substrate P from a supply roll FR1 that winds a flexible sheet substrate (hereinafter, substrate) P in a roll shape, and after each process for the substrate P, which has been sent out, is implemented continuously, the processed substrate P is wound up onto a collection roll FR2. This substrate P has a belt-shaped shape wherein the substrate P movement direction (conveying direction) is the long length, and the width direction is the short length. The device manufacturing system 10 of the first embodiment illustrates an example of a substrate P which is a film-shaped sheet, sent out from the supply roll FR1, and the substrate P sent out from the supply roll FR1 will at least pass through processing devices PR1, PR2, PR3, PR4, PR5, until it is wound up onto the collection roll FR2. In FIG. 1 is an orthogonal coordinate system wherein the X direction, Y direction, and Z direction are orthogonal. The X direction is the conveying direction of the substrate P in the horizontal plane, and is the direction that connects the supply roll FR1 and the collection roll FR2. The Y direction is a direction orthogonal to the X direction in a horizontal plane, and is the width direction of the substrate P. The Z direction is the direction orthogonal to the X direction and the Y direction (vertical direction).

This processing device PR1 is a surface processing device that performs processing steps for plasma surface processing relating to the substrate P while the substrate P, conveyed from a supply roll FR1, is conveyed along the conveying direction (+X direction) in the length direction. The surface of the substrate P is reformed by this processing device PR1, and the adhesive property of the photosensitive functional layer is improved. The processing device (first processing device) PR2 is a deposition device that performs a processing step (first processing step) for photosensitive functional layer deposition processing while the substrate P conveyed from the processing device PR1 is conveyed in the conveying direction (+X direction). By the processing device PR2 selectively or uniformly applying the photosensitive functional liquid on the surface of substrate P, the photosensitive functional layer (photosensitive thin film, coating layer, cover layer) is selectively or uniformly formed on the surface of the substrate P. Furthermore, the processing device (second processing device) PR3 is an exposure device that performs a processing step (second processing step) for exposure processing while conveying the substrate P, sent from the processing device PR2, having a photosensitive functional layer formed on the surface thereof in the conveying direction (+X direction). The processing device PR3 irradiates light patterns on the surface of the substrate P (photosensitive surface) according to patterns for display panel circuits or wiring and the like. This causes a latent image (reformed portion) corresponding to the pattern to be formed on the photosensitive functional layer. The processing device (third processing device) PR4 is a developing device that performs a processing step (third processing step) for developing processing of the wet type while the substrate P conveyed from the processing device PR3 is conveyed in the conveying direction (+X direction). This causes the pattern to be formed on the photosensitive functional layer according to the latent image. The processing device PR5 is an etching device that performs a processing step for etching processing with the photosensitive functional layer with patterns formed thereon as a mask while the substrate P is conveyed from the processing device PR4 in the conveying direction (+X direction). This causes the pattern to appear on the substrate P.

Between the processing device PR2 and the processing device PR3, a storable first storage device (first storage part) BF1 is provided over a predetermined length of substrate P; between the processing device PR3 and the processing device PR4, a storable second storage device (second storage part) BF2 is provided over a prescribed length of the substrate P. Therefore, the substrate P sent out from the processing device PR2 through the first storage device BF1 is taken into the processing device PR3, and the processing device PR3 sends out the substrate P through the second storage device BF2 to the processing device PR4. Processing devices PR1 to PR5 are disposed on the manufacturing plant installation surface. This installation surface can be a surface on installation stands or on the floor. The processing device PR3, the first storage device (storage device) BF1, and the second storage device (storage device) BF2 configure a pattern formation device 12.

The upper control device 14 controls each processing device PR1 to PR5, the first storage device BF1, and the second storage device BF2 of the device manufacturing system 10. This upper control device 14 includes a computer and a recording medium with the program recorded thereon; by the computer executing the program stored on the storage medium, it functions as the upper control device of the present first embodiment. Note that the device manufacturing system 10 of the present first embodiment is provided with five processing device PRs, but it is sufficient if it is provided with two or more processing device PRs. For example, the device manufacturing system of the present first embodiment may be provided with a total of two processing device PRs, which are the processing devices PR2, PR3, or the processing devices PR4, PR5; it may also be provided with a total of 3 processing device PRs, which are the processing devices PR2 to PR4.

The processing target of the device manufacturing system 10, which is the substrate P, will be described next. As for the substrate P, for example, a resin film, foils made from metals such as stainless steel or alloys, and the like are used. As materials for a resin film, for example, a material containing one or two or more from among the following may be used: polyethylene resin, polypropylene resin, polyester resin, ethylene-vinyl copolymer resin, polychloride vinyl resin, cellulose resin, polyamide resin, polyimide resin, polycarbonate resin, polystyrene resin, vinyl acetate resin. Further, the thickness and hardness (Young's Modulus) of the substrate P should be a range that does not produce creases or irreversible wrinkles from the buckling of the substrate P. When making a flexible display panel, touch panel, color filter, electromagnetic wave blocking filter and the like as an electronic device, a resin sheet of PET (polyethylene terephthalate) or PEN (polyethylene naphthalate) and the like with a thickness of 25 µm to 200 µm is used.

For example, in order for the deformation amount due to heat received from each process being implemented on substrate P to be substantially disregarded, it is desirable to select a substrate P with a thermal expansion coefficient that is not remarkably large. Further, on the resin film that acts as the base, when inorganic fillers such as titanium oxide, zinc oxide, alumina, silicone oxide, and the like are mixed in, the thermal expansion coefficient can be lowered as well. Further, substrate P may be a single layer body of ultra-thin glass with a thickness of approximately 100 µm manufactured by a float process and the like; it may also be a stacked layer body of this ultra-thin glass bonded with the resin film described above or bonded with a metal layer (foil) and the like of aluminum, copper and the like.

Incidentally, the flexibility of the substrate P refers to a property such that even if a force of approximately its own weight is added, there will be no shearing or fracturing, and that the substrate P can be bent. Further, included in flexibility is a property such that it will curve under a force of approximately its own weight. Further, the degree of flexibility changes based on the environment and the like, such as the material of the substrate P, size, thickness, the layer structure deposited on the substrate P, temperature, humidity, and the like. In any case, if the substrate P can be conveyed smoothly without creasing from buckling and without damage (tears or breaks generated) when the substrate P is correctly wound on members for conveying direction conversion for each type of conveying roller, rotation drum, and the like provided in the conveying path within the device manufacturing system 10 according to the present embodiment, it can be said to be within the scope of flexibility.

A substrate P configured in this manner will be the supply roll FR1 by being wound into a roll shape, and this supply roll FR1 is installed in the device manufacturing system 10. The device manufacturing system 10 installed with the supply roll FR1 repeatedly executes each type of processing for manufacturing an electronic device in relation to the substrate P sent out from the supply roll FR1. Because of this, the post-process substrate P is in a state wherein several electronic devices are connected. In other words, the substrate P sent out from the supply roll FR1 is a substrate for multiple printing.

An electronic device is configured with a plurality of pattern layers (layers with patterns formed) stacked together; one pattern layer is produced by passing through at least each of the processing devices PR1 to PR5 of the device manufacturing system 10, so in order to produce an electronic device, the processing of each processing device PR1 to PR5 of the device manufacturing system 10 illustrated in FIG. 1 is required to be performed at least two times.

The post-process substrate P is collected as the collection roll FR2 by being wound into a roll shape. The collection roll FR2 may be installed in a dicing device, which is not illustrated. The dicing device installed in the collection roll FR2 separates (dices) the post-process substrate P for each electronic device, thereby making it into a plurality of electronic devices. The dimensions of substrate P, for example, the width direction (direction of the short length) dimensions are approximately from 10 cm to 2 m, and the length direction (direction of the long length) dimensions are 10 m or greater. Note that the dimensions of substrate P are not limited to the dimensions described above.

Figure 2:
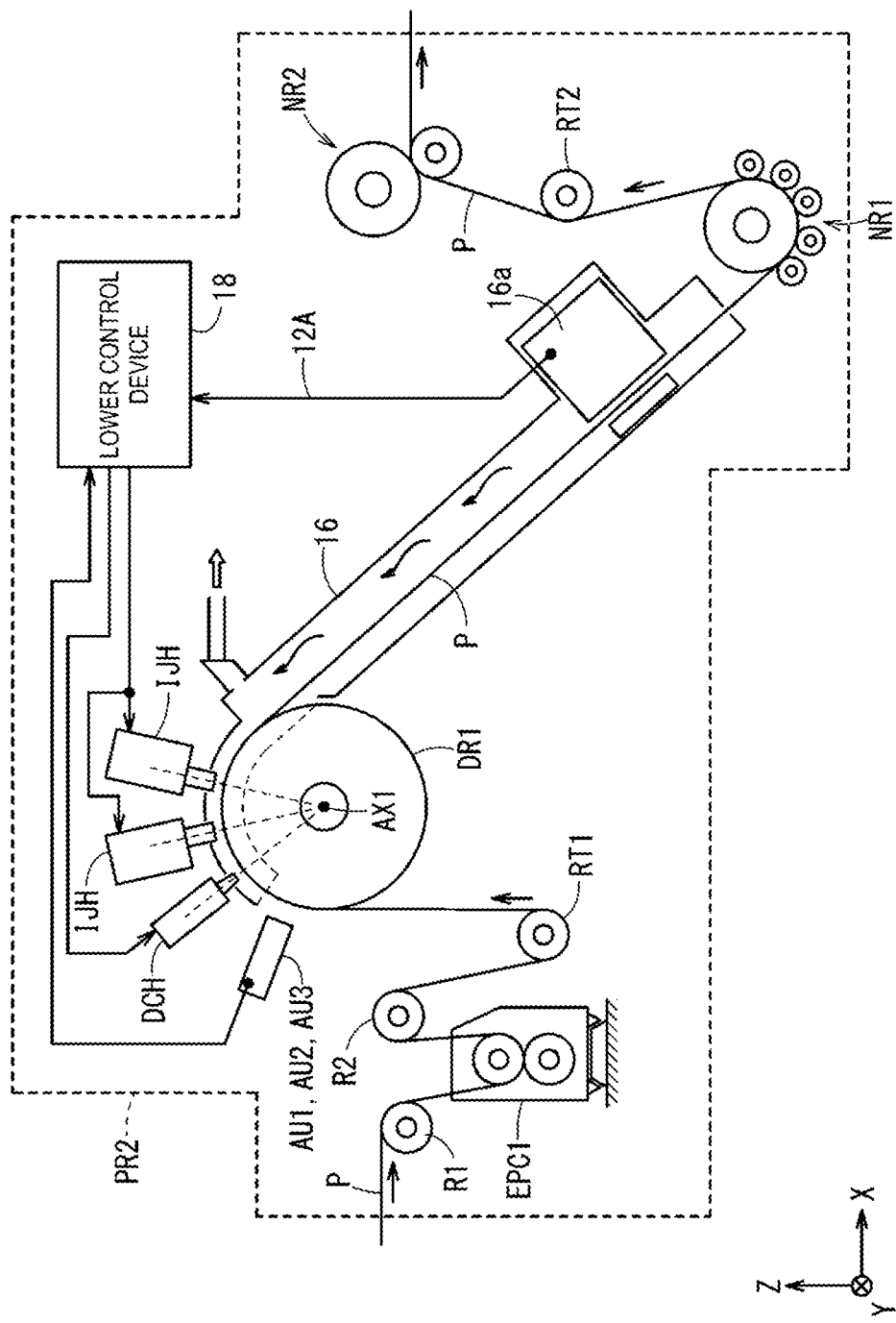
FIG. 2 is a view illustrating a configuration of a processing device which deposits a photosensitive functional layer on the substrate according to the device manufacturing system in FIG. 1.

FIG. 2 is a view illustrating the configuration of the processing device PR2. The processing device PR2 is provided with guide rollers R1, R2; an edge position controller EPC1; tension adjustment rollers RT1, RT2; a rotation drum DR1; drive rollers NR1, NR2; alignment microscopes AU; a die coating head DCH; an ink jet head IJH; a dryer device 16; and a lower control device 18. The substrate P is conveyed by the rotation drum DR1 and the drive rollers NR1, NR2.

The guide roller R1 guides the substrate P conveyed to the processing device PR2 from the processing device PR1 to the edge position controller EPC1. The edge position controller EPC1 has a plurality of rollers, and the substrate P is conveyed toward the guide roller R2 while the substrate P is moved in the width direction to correct the position of the substrate P in the width direction so that the positions of both ends (edges) of the width direction of the substrate P conveyed in a state of having a predetermined tension applied thereto will fall in a range (permissible range) of approximately from ±ten µm to several tens of µm in relation to the target position, so that there is no fluctuation in the substrate P width direction. The guide roller R2 guides the substrate P, which has been conveyed thereto, to the rotation drum DR1. The edge position controller EPC1 adjusts the position in the width direction of the substrate P so that the length direction of the substrate P conveyed into the rotation drum DR1 is orthogonal to the axial direction of a central axis AX1 of the rotation drum DR1.

The rotation drum DR1 has the central axis AX1 extending in the Y direction and an outer peripheral surface, which has a cylinder shape having a fixed radius from the central axis AX1; the rotation drum DR1 supports a portion of the substrate P along the outer peripheral surface (circumferential surface) in the length direction while conveying the substrate P in the +X direction by rotating about the central axis AX1. The rotation drum DR1 supports, on the circumferential surface, the region (part) on the substrate P imaged by the alignment microscopes AU, and the region (part) on the substrate P that is processed by the die coating head DCH or the ink jet head IJH.

Figure 4:
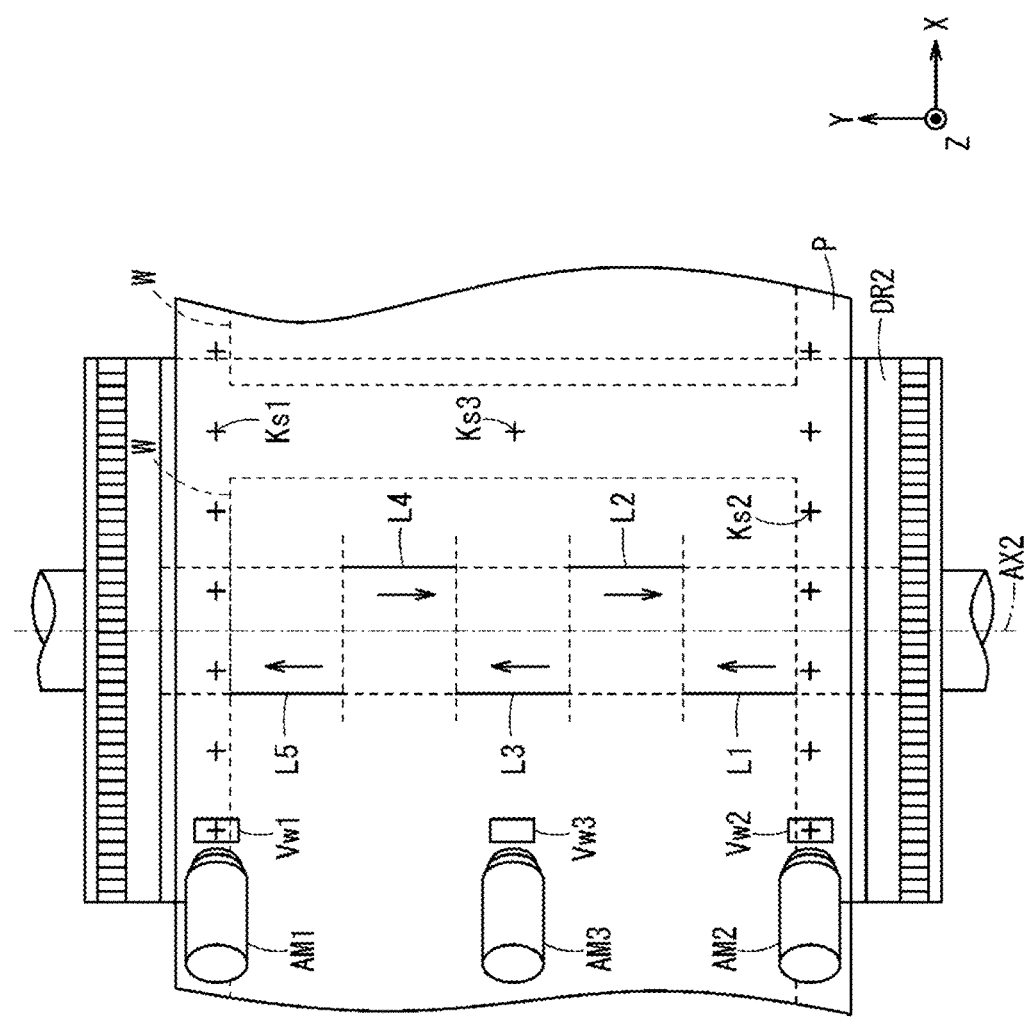
FIG. 4 is a view illustrating an alignment microscope which detects a spot light scan line scanned on the substrate by the exposure head in FIG. 3 and an alignment mark formed on the substrate.

The alignment microscopes AU (AU1 to AU3) are for detecting the alignment marks (Ks1 to Ks3) formed on the substrate P illustrated in FIG. 4, and three are provided along the Y direction. The detection regions of the alignment microscopes AU (AU1 to AU3) are disposed in a single line so that they align in the Y direction on the circumferential surface of the rotation drum DR1. The alignment marks Ks (Ks1 to Ks3) are standard marks to relatively position match (perform alignment) the electronic device region (device formation region) W serving as the photosensitive region on the substrate P formed into an electronic device, and the substrate P. The alignment marks Ks (Ks1 to Ks3) are, along with being formed in regular intervals along the length direction of the substrate P on both ends of the width direction of the substrate P, formed between the electronic device region W formed by the devices aligned along the length direction of the substrate P, and in the middle of the width direction of the substrate P.

The alignment microscopes AU (AU1 to AU3) project illumination light for alignment on the substrate P, and, by imaging that reflected light with imaging elements such as CCD or CMOS, detect the alignment marks Ks (Ks1 to Ks3). In other words, the alignment microscopes AU1 image the alignment mark Ks1 formed on the edge side of the +Y direction side of the substrate P existing within the detection region (imaging region) of the alignment microscope AU1. The alignment microscope AU2 images the alignment mark Ks2 formed on the edge of the −Y direction side of the substrate P existing in the detection region of the alignment microscope AU2. The alignment microscope AU3 images the alignment mark Ks3 formed in the middle of the width direction of the substrate P existing within the detection region of the alignment microscope AU3. The image data imaged by the alignment microscopes AU (AU1 to AU3) is sent to the lower control device 18, and the lower control device 18 calculates (detects) the position of the alignment marks Ks (Ks1 to Ks3) on the substrate P based on the image data. The size of the detection regions of the alignment microscopes AU (AU1 to AU3) on the substrate P are set according to the size and the alignment precision of the alignment marks Ks (Ks1 to Ks3), but are a size of approximately 100 to 500 µm.

As illustrated in FIG. 4, the alignment marks Ks (Ks1 to Ks3) for accurately detecting the position of the substrate P are generally provided in the outer peripheral portion of the device formation region W, but it does not necessarily have to be the outer peripheral portion, and may be provided in a blank portion where a circuit pattern for the device does not exist, even if it is within the device formation region W. Further, an alignment system may be used wherein patterns (partial patterns such as an image region, wiring portion, electrode portion, terminal portion, or via hole) formed in specific positions from among a part of the circuit patterns formed in the device formation region W themselves are image-recognized as alignment marks to detect position.

The die coating head DCH broadly and uniformly applies the photosensitive functional fluid in relation to the substrate P. The ink jet head IJH selectively applies the photosensitive functional fluid in relation to the substrate P. The die coating head DCH and the ink jet head IJH apply the photosensitive functional fluid to the substrate P based on the position of the alignment marks Ks (Ks1 to Ks3) on the substrate P detected by using the alignment microscopes AU (AU1 to AU3). The die coating head DCH and the ink jet head IJH apply the photosensitive functional fluid to the electronic device region W. The die coating head DCH and the ink jet head IJH are provided on the downstream side (+X direction side) of the conveying direction of the substrate P in relation to the alignment microscopes AU (AU1 to AU3), and the ink jet head IJH is provided on the downstream side (+X direction side) of the conveying direction of the substrate P in relation to the die coating head DCH. A plurality of the ink jet head IJH is provided along the conveying direction (+X direction) of the substrate P. The region on the substrate P with photosensitive functional fluid applied by the die coating head DCH and the ink jet head IJH is supported by the circumferential surface of the rotation drum DR1.

The dryer device 16 is provided on the downstream side (+X direction side) of the conveying direction of the substrate P in relation to the die coating head DCH and the ink jet head IJH, and forms a photosensitive functional layer on the substrate P by drying the photosensitive functional fluid on the substrate P applied by the die coating head DCH and the ink jet head IJH. The dryer device 16 removes the solute (solvent or water) included in the photosensitive functional fluid by blowing air for drying such as hot air or dry air to dry the photosensitive functional fluid.

A traditional photosensitive functional fluid is photoresist, but as for materials that do not require developing processing, there are photosensitive silane coupling agents (SAM) wherein the hydrophobic or hydrophilic properties of portions irradiated with ultraviolet rays are reformed, or photosensitive reducing agents wherein a plating reduction group is exposed in the portions irradiated with ultraviolet rays. When a photosensitive silane coupling agent is used as a photosensitive functional fluid, the pattern portion exposed to ultraviolet rays on the substrate P are reformed from hydrophobic to hydrophilic. This causes a pattern layer to be able to be formed by selectively applying a conductive ink (an ink containing conductive nano-particles such as silver or copper) or a fluid body containing semiconductor material, and the like. When using a photosensitive reducing agent as a photosensitive fluid, the pattern portion on the substrate P exposed to ultraviolet rays is reformed, exposing a plating reduction group. This causes a pattern layer to form (precipitate) from palladium by immersing the substrate P in plating fluid including palladium ions and the like for a set time, immediately after exposure. This sort of plating processing is an additive (additive) process, but other than that, when assuming an etching processing as a subtractive (subtractive) process, the substrate P sent by the processing device PR3 may have PET or PEN as a base material with a metallic film such as aluminum (Al) or copper (Cu) deposited entirely or selectively on the surface, and furthermore, it may be laminated with the photo resistor layer thereon. In the present first embodiment, photoresist is used as the photosensitive functional layer.

In the dryer device 16, a film thickness measuring device 16a that measures the film thickness of the photosensitive functional layer formed on the substrate P is provided. This film thickness measuring device 16a measures the contact or non-contact film thickness through an electromagnetic method, an overcurrent method, an overcurrent phase method, a fluorescent X-ray method, an electric resistance method, a β wave back scatter method, a magnetic method, an ultra-sonic wave method, and the like. The substrate P with a photosensitive functional layer formed thereon is guided to the drive roller NR1 by the dryer device 16. The drive roller NR1 guides the substrate P to the drive roller NR2 by rotating while sandwiching both sides of the substrate P. The drive roller NR2 supplies the substrate P conveyed by the drive roller NR1 to the first storage device BF1 by rotating while sandwiching both sides of the substrate P. The tension adjustment roller RT1 is biased in the −Z direction, and applies a predetermined tension to the substrate P conveyed by the rotation drum DR1. The tension adjustment roller RT2 is biased in the −X direction, and applies a predetermined tension to the substrate P conveyed by the drive roller NR2. The drive roller NR1, NR2, and the rotation drum DR1, which convey the substrate P, rotate from the applied rotational torque from a rotation drive source (omitted from the figure) having a motor or speed reducer and the like that is controlled by the lower control device 18. The conveying speed of the substrate P in the processing device PR2 is determined by the rotation speed of the drive roller NR1, NR2, and the rotation drum DR1. Further, the rotation speed signal (the substrate P conveying speed signal) sent from the encoder, which is not illustrated, and which is provided on the drive roller NR1, NR2, the rotation drum DR1, and the like is sent to the lower control device 18.

The lower control device 18 follows the control of the upper control device 14, and controls each part of the processing device PR2. For example, the lower control device 18 controls the conveying speed of the substrate P conveyed within the processing device PR2, the edge position controller EPC1, the die coating head DCH, the ink jet head IJH, and the dryer device 16. Also, the lower control device 18 outputs, to the upper control device 14, the position information of the alignment marks Ks (Ks1 to Ks3) on the substrate P detected by the alignment microscopes AU (AU1 to AU3), film thickness information detected by the film thickness measuring device 16a, rotation speed information (conveying speed information of the substrate P within the processing device PR2), and the like. The lower control device 18 includes a computer and a recording medium with a program recorded thereon, and by executing the program recorded on the recording medium, the computer functions as the lower control device 18 of the present first embodiment. This lower control device 18 may be a part of the upper control device 14, and may be a separate control device from the upper control device 14.

Figure 3:
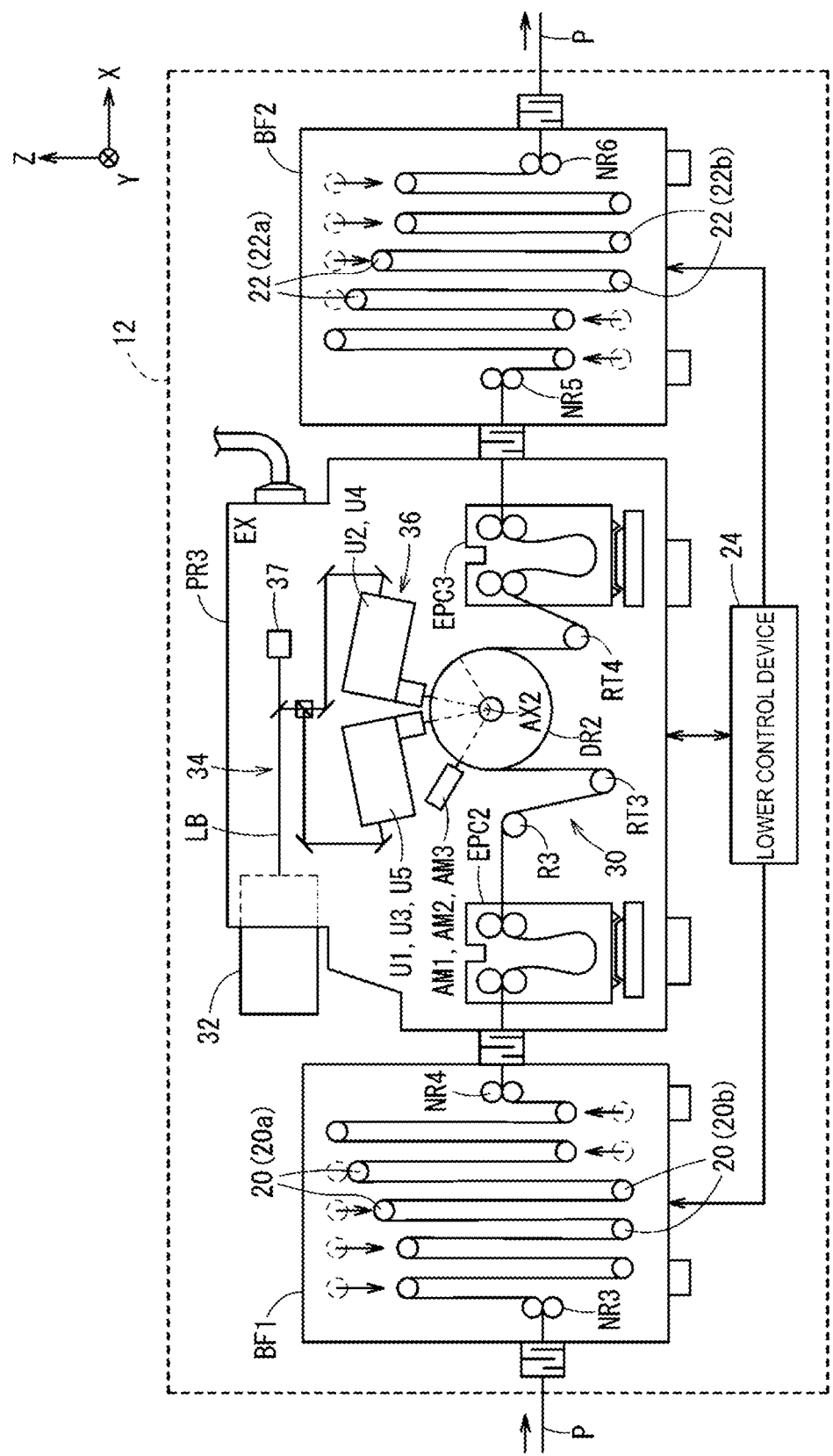
FIG. 3 is a view illustrating a configuration of a pattern forming device that performs substrate storage and exposure according to the device manufacturing system in FIG. 1.

FIG. 3 is a view illustrating the configuration of a pattern formation device 12. The first storage device BF1 of the pattern formation device 12 has a drive roller NR3, NR4, and a plurality of dancer rollers 20. The drive roller NR3 rotates while sandwiching both surfaces of the substrate P sent by the processing device PR2, and conveys the substrate P into the first storage device BF1. The drive roller NR4 rotates while sandwiching both surfaces of the substrate P, and conveys the substrate P in the first storage device BF1 to the processing device PR3. The plurality of the dancer rollers 20 is provided between the drive roller NR3 and the drive roller NR4, and applies a predetermined tension to the substrate P. The plurality of dancer rollers 20 is able to move in the Z direction; the upper (+Z direction side) dancer roller 20 (20a) is biased toward the +Z direction side, and the lower (−Z direction side) dancer roller 20 (20b) is biased toward the −Z direction side. This dancer roller 20a and the dancer roller 20b are alternately disposed in relation to the X direction.

If the conveying speed of the substrate P conveyed into the first storage device BF1 becomes comparatively fast in relation to the conveying speed of the substrate P conveyed out from the first storage device BF1, the length (storage length) of the substrate P stored by the first storage device BF1 increases. If the storage length of the first storage device BF1 becomes longer, the dancer roller 20a moves in the +Z direction, and the dancer roller 20b moves in the −Z direction by the bias force. This makes it possible for the substrate P to be stored with a predetermined length, in a state where the substrate P has a predetermined tension applied thereto, even when the storage volume of the first storage device BF1 has increased. Conversely, if the conveying speed of the substrate P conveyed into the first storage device BF1 becomes comparatively slow in relation to the conveying speed of the substrate P conveyed out of the first storage device BF1, the length (storage length) of the substrate P stored by the first storage device BF1 decreases. If the storage length of the first storage device BF1 decreases, the dancer roller 20a moves in the −Z direction, and the dancer roller 20b moves in the +Z direction, against the bias force. In any case, the first storage device BF1 can store the substrate P in a state where a predetermined tension is applied to the substrate P. The drive roller NR3, NR4 rotate due to applied rotational torque from a rotation drive source (omitted from the figure) having a motor or speed reducer and the like, being controlled by the lower control device 24. The conveying speed of the substrate P conveyed into the first storage device BF1 is determined by the rotation speed of the drive roller NR3; the conveying speed of the substrate P conveyed out from the first storage device BF1 is determined by the rotation speed of the drive roller NR4. Further, the rotation speed signal sent from the encoder, which is not illustrated in the drawings, and is provided on the drive roller NR3, NR4, is sent by the lower control device 24 of the pattern formation device 12.

The second storage device BF2 of the pattern formation device 12 has a drive roller NR5, NR6 and a plurality of dancer rollers 22. The drive roller NR5 rotates while sandwiching both surfaces of the substrate P sent from the processing device PR3, and conveys the substrate P into the second storage device BF2. The drive roller NR6 conveys out the substrate P within the second storage device BF2 to the processing device PR4 while sandwiching both surfaces of the substrate P. The plurality of the dancer roller 22 is provided between the drive roller NR5 and the drive roller NR6, and applies a predetermined tension in relation to the substrate P. The plurality of dancer rollers 22 is able to move in the Z direction; the upper (+Z direction side) dancer roller 22 (22a) is biased in the +Z direction, and the lower (−Z direction side) dancer roller 22 (22b) is biased in the −Z direction. This dancer roller 20a and the dancer roller 20b are alternately disposed in relation to the X direction. By having such configuration, the second storage device BF2 is able to store the substrate P in a condition with a predetermined tension applied to the substrate P, similar to the first storage device BF1. Note that the configuration of the first storage device BF1 and the second storage device BF2 are identical. The drive roller NR5, NR6 rotate due to applied rotational torque from a rotation drive source (not illustrated) having a motor or speed reducer and the like that is controlled by the lower control device 24. The conveying speed of the substrate P conveyed into the second storage device BF2 is determined by the rotation speed of the drive roller NR5; the conveying speed of the substrate P conveyed out from the second storage device BF2 is determined by the rotation speed of the drive roller NR6. Further, the rotation speed signal sent from the encoder, which is not illustrated in the drawings, and is provided by the drive roller NR5, NR6, is sent by the lower control device 24.

The processing device PR3 of the pattern formation device 12 is a direct drawing-type exposure device EX that does not use a mask, which is what is known as a luster scanner-type exposure device, wherein a light pattern is irradiated according to patterns for circuits or wiring and the like for a display, in relation to the substrate P supplied from the processing device PR2 via the first storage device BF1. Examples of a pattern for circuits or wiring for a display include a TFT source electrode or a drain electrode for configuring a display and a pattern for wiring and the like belonging thereto, or a TFT gate electrode and a pattern for wiring and the like belonging thereto. While conveying the substrate P in the X direction, the processing device PR3 performs drawing exposure of the light pattern on the surface (photosensitive surface) of the substrate P through high speed alteration (on/off) of spotlight strength according to the pattern data (drawing data) while performing a 1-dimensional scan of the spotlight of the laser light LB for exposure in a predetermined scan direction (Y direction) on the substrate P. In other words, with conveying in the +X direction of the substrate P (secondary scan), and scanning (primary scan) towards the spotlight scan direction (Y direction), the spotlight is scanned in two dimensions on the substrate P, and light energy (energy line) corresponding to the pattern in the substrate P is irradiated. This causes a latent image (reformed portion) corresponding to a predetermined pattern to be formed on the photosensitive functional layer. This pattern data may be recorded in the recording medium of the lower control device 24 of the pattern formation device 12, or it may be recorded in the recording medium of the upper control device 14.

The processing device PR3 is provided with a conveying part 30, a light source device 32, a light induction optical system 34, and an exposure head 36. The conveying part 30 conveys the substrate P, conveyed from the processing device PR2 via the first storage device BF1, towards the processing device PR4. The conveying part 30 has, along the substrate P conveying direction and in order from the upstream side (−X direction), an edge position controller EPC2, a guide roller R3, a tension adjustment roller RT3, a rotation drum DR2, a tension adjustment roller RT4, and an edge position controller EPC3.

The edge position controller EPC2 has a plurality of rollers, similar to the edge position controller EPC1; the substrate P is moved in the width direction to correct the position of the substrate P in the width direction so as to keep the positions of both ends (edges) of the width direction of the substrate P in a range (permissible range) of approximately ±ten μm to several tens of μm in relation to the target position so that there is no fluctuation in the substrate P width direction, while the substrate P is conveyed toward the rotation drum DR2. The edge position controller EPC2 adjusts the position in the width direction of the substrate P so that the length direction of the substrate P conveyed into the rotation drum DR2 is orthogonal to the axial direction of a central axis AX2 of the rotation drum DR2. The guide roller R3 guides the substrate P sent out from the edge position controller EPC2 to the rotation drum DR2.

The rotation drum DR2 has the central axis AX2 extending in the Y direction and an outer peripheral surface, which has a cylinder shape having a fixed radius from the central axis AX2; the rotation drum DR2 supports a portion of the substrate P along the outer peripheral surface (circumferential surface) in the length direction while conveying the substrate P in the +X direction by rotating with the central axis AX2 as its center. The rotation drum DR2 supports on the circumferential surface the part on the substrate P with a pattern exposed.

The edge position controller EPC 3 has a plurality of rollers, similar to the edge position controller 2; the substrate P is moved in the width direction to correct the position of the substrate P in the width direction so as to keep the positions of both ends (edges) of the width direction of the substrate P in a range (permissible range) of approximately ±ten μm to several tens of μm in relation to the target position so that there is no fluctuation in the substrate P width direction, while the substrate P is conveyed toward the processing device PR4. The tension adjustment rollers RT3, RT4 are biased in the −Z direction, and apply a predetermined tension to the substrate P supported by and wound on the rotation drum DR2. The rotation drum DR2 rotates due to applied rotational torque from a rotation drive source (omitted from the figure) having a motor or speed reducer and the like that is controlled by the lower control device 24. The conveying speed of the substrate P in the processing device PR3 is determined by the rotation speed of the rotation drum DR2. Further, the rotation speed signal sent from the encoder, which is not illustrated in the drawings, and is provided on the rotation drum DR2 and the like, is sent by the lower control device 24.

The light source device 32 has a laser light source, and emits an ultraviolet ray laser light (irradiation light, exposure beam) LB used in exposure. The laser light LB may be an ultraviolet ray light having a peak wavelength in a wavelength band of 370 nm or less. The laser light LB may be pulse light generated with a light-generation frequency Fs. The laser light LB emitted by the light source device 32 is guided by the light induction optical system 34, and in addition to being incident to the exposure head 36, it is incident to the strength sensor 37. The strength sensor 37 is a sensor that detects the strength of the laser light LB.

The light source head 36 is provided with a plurality of drawing units U (U1 to U5), each with the laser light LB from the light source device 32 being incident thereunto. In other words, the laser light LB from the light source 32 is guided by a light induction optical system 34 having a reflective mirror or beam splitter and the like, and is incident to a plurality of drawing units U (U1 to U5). The exposure head 36 performs drawing exposure of patterns on a single portion of the substrate P supported by the circumferential surface of the rotation drum DR2, through a plurality of drawing units U (U1 to U5). The exposure head 36 has a plurality of exposure units U (U1 to U5) with the same configuration, and is what is known as a multi-beam type exposure head 36. The drawing units U1, U3, U5 are disposed on the upstream side (−X direction side) of the conveying direction of the substrate P in relation to the central axis AX2 of the rotation drum DR2; the drawing units U2, U4 are disposed on the downstream side (+X direction side) of the conveying direction of the substrate P in relation to the central axis AX2 of the rotation drum DR2.

Each drawing unit U causes the incident laser light LB to converge on the substrate P to make it a spotlight, and scans the spotlight along the scanning line. The scan line L of each drawing unit U, as illustrated in FIG. 4, is not mutually separated in relation to the Y direction (width direction of the substrate P), but is set to be joined together. In FIG. 4, the scan line L of the drawing unit U1 is expressed as L1, and the scan line L of the drawing unit U2 is expressed as L2. Similarly, the scan lines L of the drawing units U3, U4, U5 are expressed as L3, L4, L5. This allows each drawing unit to be allotted a scanning region so that the entire width direction of the electronic device region (exposure region) W is covered by all of the drawing units U1 to U5. Note that, for example, if the drawing width (length of the scan line L) of the Y direction of a drawing unit U is approximately from 20 to 50 mm, the width of the drawable Y direction will be widened by approximately from 100 to 250 mm by disposing the three odd-numbered drawing units U1, U3, U5 and the two even-numbered drawing units U2, U4, being a total of five drawing units U, in the Y direction.

The drawing unit U is a known technology, as is disclosed in WO 2013/146184 (see FIG. 36); the drawing unit U will be described simply using FIG. 5. Note that each drawing unit U (U1 to U5) has the same configuration, so only the drawing unit U2 is described, and a description of the other drawing units U is omitted.

Figure 5:
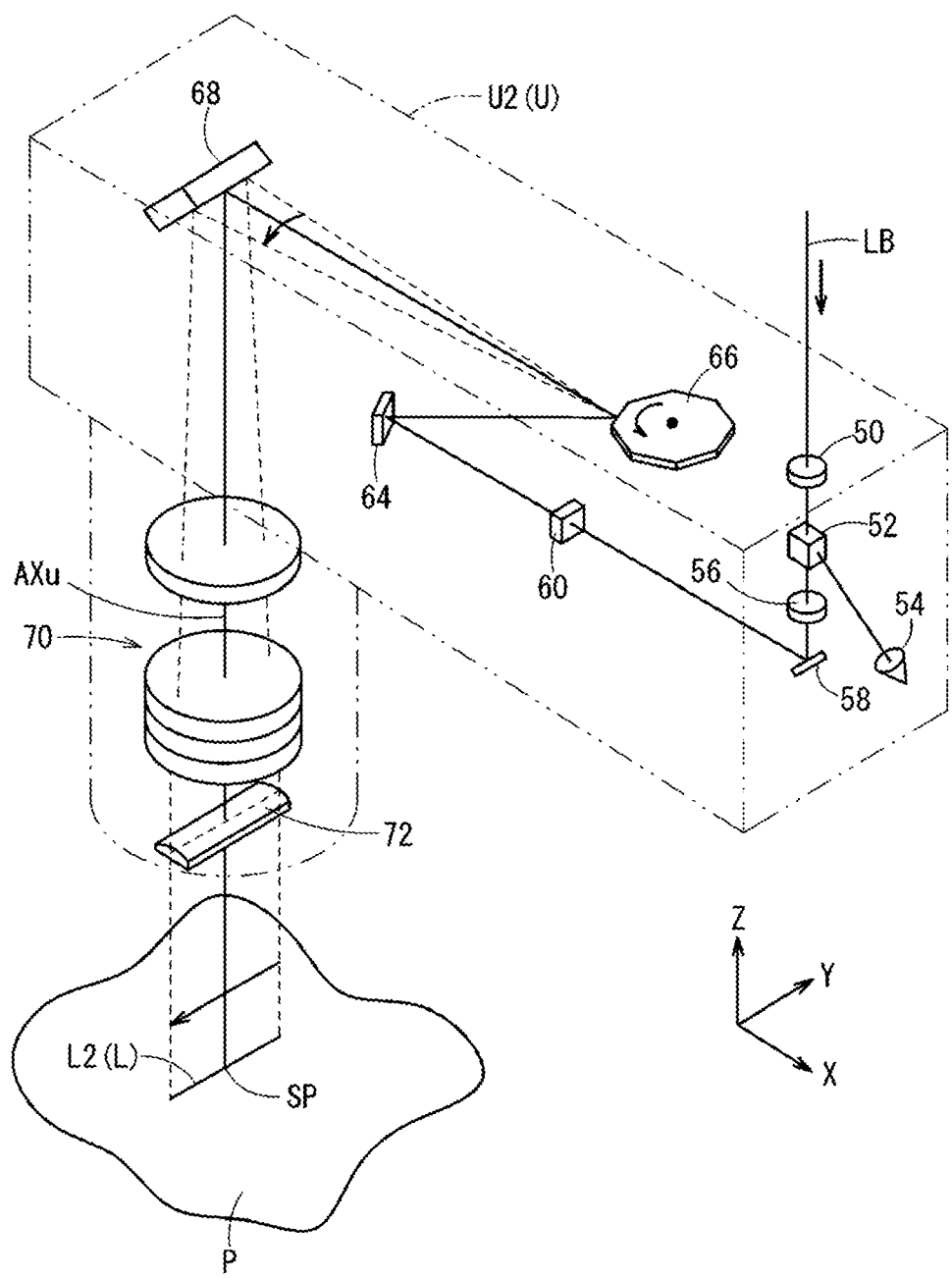
FIG. 5 is a view illustrating a configuration of a drawing unit that configures the exposure head in FIG. 4.

As is illustrated in FIG. 5, the drawing unit U2, for example, has a condensing lens 50, an optical element for drawing (optical modulation element) 52, an absorber 54, a collimating lens 56, a reflective mirror 58, a cylindrical lens 60, a reflective mirror 64, a polygon mirror (light scanning member) 66, a reflective mirror 68, an f-θ lens 70, and a cylindrical lens 72.

The laser light LB incident to the drawing unit U2 progresses from the upper direction of a vertical direction to the lower direction (−Z direction), and is incidental to the optical element for drawing 52 via the condenser lens 50. The condenser lens 50 causes the laser light LB incident to the optical element for drawing 52 to condense (converge) so that it becomes the beam waist within the optical element for drawing 52. The optical element for drawing 52 has transparency in relation to the laser light LB, and, for example, an acoustic optical modulator element (AOM: Acousto-Optic Modulator) is used.

When the drive signal (high frequency signal) from the lower control device 24 is in the off state, the optical element for drawing 52 penetrates the incidental laser light LB in the absorber 54, and when the drive signal (high frequency signal) from the lower control device 24 is in the on state, the optical element for drawing 52 refracts the incidental laser light LB and faces towards the reflective mirror 58. The absorber 54 is a light trap that absorbs the laser light LB in order to suppress the leakage of the laser light LB to external parts. This allows switching of the laser light LB to face the reflective mirror 58 or to face the absorber 54 by high speed on/off of the drive signal (ultrasonic wave frequency) for drawing that should be impressed on the element for drawing 52, according to the pattern data (white black). This means that when looking above the substrate P, the strength of the laser light LB (spot light SP) reaching the photosensitive surface can be modulated at a high speed to either a high level or a low level (for example, level zero) according to the pattern data.

The collimating lens 56 makes the laser light LB that goes toward the reflective mirror 58 from the optical element for drawing 52 into parallel light. The reflective mirror 58 reflects the incidental laser light LB in the −X direction, and irradiates the reflective mirror 64 via the cylindrical lens 60. The reflective mirror 64 irradiates the polygon mirror 66 with the incidental laser light LB. The polygon mirror (rotating multi-surfaced mirror) 66 continuously changes the reflection angle of the laser light LB by rotating, and scans the position of the laser light irradiated on the substrate P in the scanning direction (the substrate P width direction). The polygon mirror 66 rotates at a set speed from a rotation drive source (for example, a motor or speed reducer and the like), which is not illustrated, controlled by the lower control device 24. Further, the rotation speed signal (spot light SP scan speed signal) sent out by the encoder, which is not illustrated, and is provided on the polygon mirror 66, is sent to the lower control device 24.

The cylindrical lens 60 provided between the reflective mirror 58 and the reflective mirror 64 condenses (converges) the laser light LB on the reflective surface of the polygon mirror 66 in relation to the non-scanning direction (Z direction), which is orthogonal to the scanning direction. Even if the reflective surface is inclined in relation to the Z direction due to the cylindrical lens 60 (inclined from the balanced state of the XY surface normal vector and the reflective surface), the influence thereof can be suppressed, suppressing deviation from the X direction of the irradiation position of the laser light LB irradiated on the substrate P.

The laser light LB reflected by the polygon mirror 66 is reflected in the −Z direction by the reflective mirror 68, and is incidental to an f-θ lens 70 having an optical axis AXu, which is parallel to the Z axis. The f-θ lens 70 is a telecentric optical system wherein the main light beam of the laser light LB projected on the substrate P is a constant normal vector of the surface of the substrate P during scanning, which makes it possible to scan the laser light LB accurately and at a consistent speed in the Y direction. The laser light LB irradiated from the f-θ lens 70 becomes a microscopic spot light SP with a semi-circular shape with a diameter of approximately a several μm (for example, 3 μm), and is irradiated on the substrate P via the cylindrical lens 72, wherein the bus line is parallel to the Y direction. The spot light (scanning spot light) SP is scanned one dimensionally by the polygon mirror 66 in a direction along the scan line L2 extending in the Y direction.

Further, the processing device PR3, as illustrated in FIG. 3 and FIG. 4, is provided with 3 alignment microscopes AM (AM1 to AM3) to detect the alignment marks Ks (Ks1 to Ks3). The detection regions Vw (Vw1 to Vw3) of the alignment microscopes AM (AM1 to AM3) are disposed in a single line so they align in the Y-axis direction on the circumferential surface. The alignment microscopes AM (AM1 to AM3) project illumination light for alignment on the substrate P, and, by imaging that reflected light with imaging elements such as CCD or CMOS, detect the alignment marks Ks (Ks1 to Ks3). In other words, the alignment microscope AM1 images the alignment mark Ks1 formed in the edge of the +Y direction side of the substrate P existing in the detection region (imaging region) Vw1. The alignment microscope AM2 images the alignment mark Ks2 formed on the edge of the −Y direction side of the substrate P existing in the detection region Vw2. The alignment microscope AM3 images the alignment mark Ks3 formed in the center of the width direction of the substrate P existing in the detection region Vw3.

The image data imaged by the alignment microscopes AM (AM1 to AM3) is sent to the image processing part provided in the lower control device 24; the image processing part of the lower control device 24 calculates (detects) the position of the alignment marks Ks (Ks1 to Ks3) based on the image data. The size of the detection regions Vw (Vw1 to Vw3) on the substrate P are set according to the size and alignment precision of the alignment marks Ks (Ks 1 to Ks3), but are a size of approximately from 100 to 500 μm. Further, the illumination lamp for alignment is a light with a wavelength region that is mostly not sensitive in relation to the photosensitive functional layer on the substrate P, for example, a broadband light with a wavelength width of approximately 500 to 800 nm, or a white light that does not include an ultra violet region wavelength, and the like.

The lower control device 24 follows the control of the upper control device 14, and controls each part, which is the first storage device BF1, the second storage device BF2, and the processing device PR3, that configures the pattern forming device 12. For example, the lower control device 24 controls the conveying speed of the substrate P conveyed within the processing device PR3, the edge position controller EPC2, EPC3, the light source device 32, the rotation of the polygon mirror 66, the optical element for drawing 52, and the like. Further, the lower control device 24 outputs, to the upper control device 14, the position information of the alignment marks Ks (Ks1 to Ks3) on the substrate P detected by the alignment microscopes AM (AM1 to AM3), rotation speed information (conveying speed information of the substrate P within the processing device PR3, scanning speed information of the spot light SP), strength information of the laser light LB detected by the strength sensor 37, and the like. The lower control device 24 includes a computer and a recording medium with a program recorded thereon, and by executing the program recorded on the recording medium, the computer functions as the lower control device 24 of the present first embodiment. This lower control device 24 may be a part of the upper control device 14, and may be a separate control device from the upper control device 14.

Figure 6:
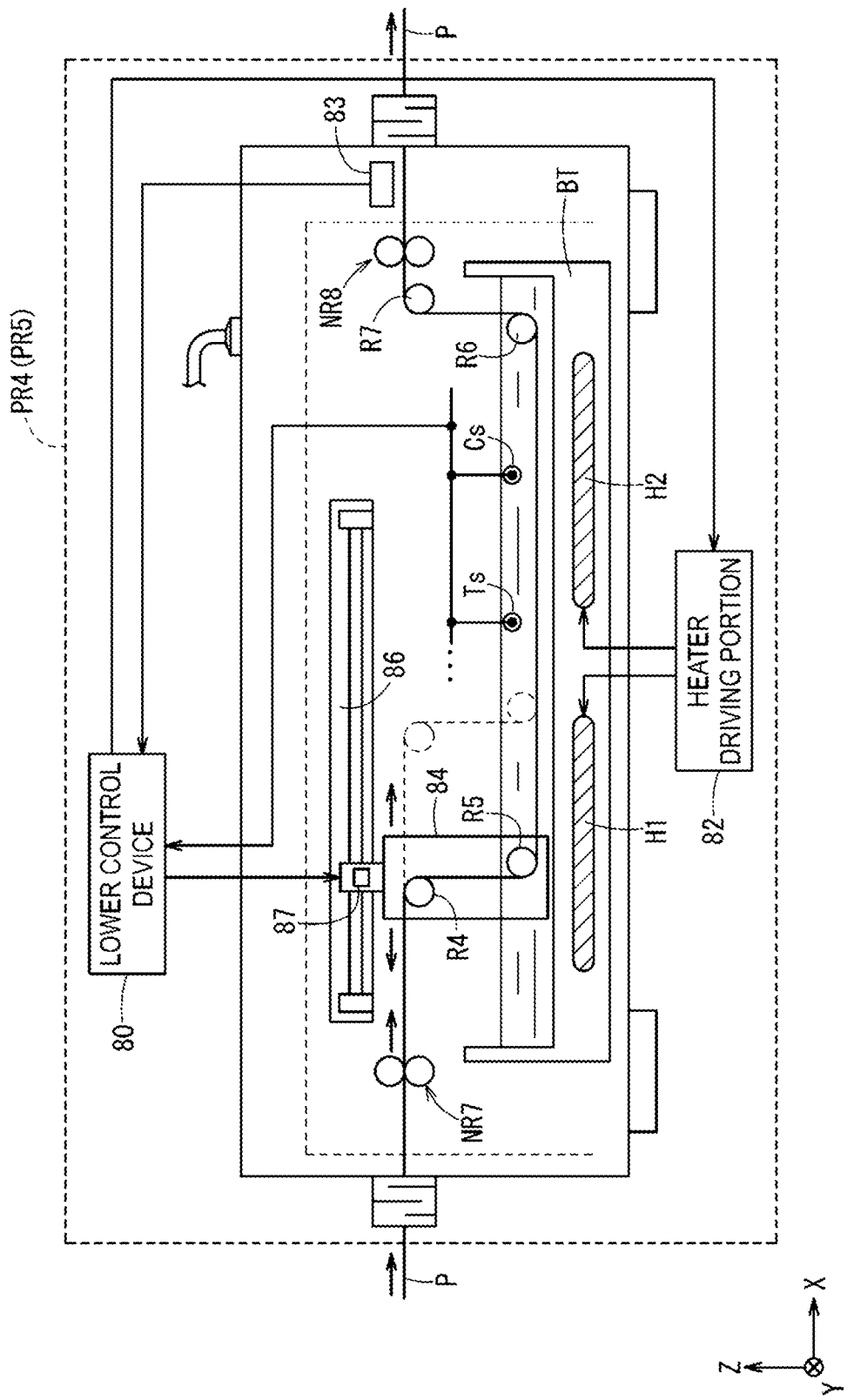
FIG. 6 is a view illustrating a configuration of a processing device for performing development processing, from within the device manufacturing system in FIG. 1.

FIG. 6 is a view illustrating a configuration of the processing device PR4. The processing device PR4 has a processing tank BT with a developing fluid collected therein, guide rollers R4 to R7, which form a conveying circuit of the substrate P so that the substrate P is soaked in the developing fluid collected in the processing tank BT, a drive roller NR7, NR8, and a lower control device 80. In the bottom of the processing tank BT, a heater H1, H2 is provided to adjust the temperature of the developing fluid; the heater H1, H2 drives and generates heat from the heater drive part 82, under the control of the lower control device 80.

The drive roller NR7 guides the substrate P to the guide roller R4 by rotating while sandwiching both surfaces of the substrate P sent out from the processing device PR3 via the second storage device BF2. The guide roller R4 bends the substrate P conveyed in the +X direction to the −Z direction side and guides it to the guide roller R5. The guide roller R5 bends the substrate P conveyed in the −Z direction to the +X direction side and guides it to the guide roller R6. The guide roller R6 bends the substrate P conveyed in the +X direction to the +Z direction side and guides it to guide roller R7. The guide roller R7 bends the substrate P conveyed in the +Z direction to the +X direction side and guides it to the drive roller NR8. The drive roller NR8 conveys the substrate P to the processing device PR5 while sandwiching both surfaces of the substrate P sent out. The substrate P is immersed in the developing fluid by the guide rollers R5, R6. The drive rollers NR7, NR8 rotate due to applied rotational torque from a rotation drive source (not illustrated) having a motor or speed reducer and the like controlled by the lower control device 80. The conveying speed of the substrate P in the processing device PR4 is determined by the rotation speed of the drive rollers NR7, NR8. Further, the rotation speed signal (the substrate P conveying speed signal) sent out from the encoder, which is not illustrated, and is provided on the drive rollers NR7, NR8, is sent to the lower control device 80. Note that an imaging device 83, which images the developed surface of the substrate P, is provided within the processing device PR4. The imaging device 83 is provided in the downstream side (+X direction side) of the conveying direction of the substrate P in relation to the drive roller NR8. The imaging device 83 images the patterns formed in the photosensitive functional layer by development.

The guide roller R4, R5 are provided on a moveable member 84, and the moveable member 84 has a drive part such as a linear motor, and can move in the X direction along the guide rail 86. In the moveable member 84, a position sensor is provided for detecting the position in the X direction of the moveable member 84; the position information of the moveable member 84 detected by the position sensor 87 is sent to the lower control device 80. When the moveable member 84 moves in the −X direction side along the guide rail 86, the distance between the guide rails R5, R6 increases, causing the time that the substrate P is immersed in the developing fluid (immersion time) to lengthen. Further, if the moveable member 84 moves in the +X direction side, the distance between the guide rollers R5, R6 decreases, causing the time that the substrate P is immersed in the developing fluid (immersion time) to shorten. This makes it possible to adjust the time that the substrate P is immersed in the developing fluid. Further, the processing device PR4 has a temperature sensor T that detects the temperature of the developing fluid and a concentration sensor Cs that detects the concentration of the developing fluid. By immersing the substrate P in the developing fluid, patterns are formed in the photosensitive functional layer according to the latent image (reformed portion) formed in the photosensitive functional layer. When the photosensitive functional layer is a positive type photoresist, the portion irradiated with ultraviolet rays is reformed, and the reformed portion is dissolved and removed by the developing fluid. Further, when the photosensitive functional layer is a negative type photoresist, the portion irradiated with ultraviolet rays is reformed, and the non-reformed portion that was not irradiated with ultraviolet rays is dissolved and removed by the developing fluid. In the present first embodiment, the photosensitive functional layer is described as a positive type. Note that the processing device PR4 may have a dryer mechanism, although not illustrated, for removing the developing fluid adhered to the substrate P, in relation to the substrate P conveyed from the processing device PR5.

The lower control device 80 follows the control of the upper control device 14, and controls each part of the processing device PR4. For example, the lower control device 80 controls the conveying speed of the substrate P conveyed within the processing device PR4, the heater drive part 82, and the moveable member 84. Further, the lower control device 80 outputs, to the upper control device 14, the temperature information and concentration information of the developing fluid detected by the temperature sensor Ts and the concentration sensor Cs, the position information of the moveable member 84 detected by the position sensor 87, the image data detected by the imaging device 83, rotation speed information (conveying speed information of the substrate P within the processing device PR4), and the like. The lower control device 80 includes a computer and a recording medium with a program recorded thereon, and by executing the program recorded on the recording medium, the computer functions as the lower control device 80 of the present first embodiment. This lower control device 80 may be a part of the upper control device 14, and may be a separate device from the upper control device 14.

Note that when the photosensitive functional layer is a silane coupling agent or a photosensitive reducing agent, within the processing tank BT of the processing device PR4, a substitute for a developing fluid, for example, a plating solution including a material (metallic foil) for electronic devices such as palladium ion, can be collected. In other words, in this case, the processing device PR4 is a plating device, which performs a processing step (third processing step) of plating processing. A material for electronic devices is precipitated according to the latent image (reformed portion) formed in the photosensitive functional layer by immersing the substrate P in a plating solution, and a metallic foil layer (conductive) pattern is formed in the substrate P.

Since the processing device PR5 for performing etching basically has the same configuration as the processing device PR4 (not illustrated), but an etching fluid (corrosive fluid) is kept in the processing tank BT instead of the development fluid. Therefore, when the movable member 84 of the processing device PR5 moves to the −X direction side, the time that the substrate P is immersed in the etching fluid (immersion time) is lengthened, and when the movable member 84 moves to the +X direction side, the time that the substrate P is immersed in the etching fluid (immersion time) is shortened. Furthermore, the temperature of the etching fluid is detected by the temperature sensor Ts of the processing device PR5, and the concentration of the etching fluid is detected by the concentration sensor Cs. By immersing the substrate P in the etching fluid using the processing device PR5, a metallic thin film (Al or Cu and the like) formed in the lower layer of the photosensitive functional layer is etched by using the photosensitive layer in which a pattern is formed as a mask. As a result, the pattern of the metal layer appears on the substrate P. The imaging device 83 of the processing device PR5 images the pattern on the metal layer formed on the substrate P by etching. The substrate P in which the processing is performed by the processing device PR5 is sent to the processing device PR for performing the next processing. When a plating process is performed by the processing device PR4, since the etching process is unnecessary, another processing device PR, for example, a processing device for performing drying or the like, is provided instead of the processing device PR5.

Here, in order for a pattern on the desired metal layer to appear on the substrate P using the device manufacturing system 10, each processing device PR1 to PR5 performs each process on the substrate P according to the setting conditions. For example, processing conditions for defining the voltage for emitting plasma, the irradiation time for irradiating plasma, and the like, and the conveying speed condition for the substrate P are set as the setting conditions of the processing device PR1. The processing device PR1 performs plasma surface processing on the substrate P while conveying the substrate P according to the setting conditions. Processing conditions (first processing conditions) including a region condition for defining a region where the photosensitive functional layer is formed and a film thickness condition for defining the film thickness of the photosensitive functional layer, and a conveying speed condition of the substrate P are set as the setting conditions (first setting conditions) of the processing device PR2. The processing device PR2 performs a film formation processing of the photosensitive functional layer while conveying the substrate P according to the setting conditions.

Processing conditions (second processing conditions), including a strength condition for defining the strength of the laser light LB, a scanning speed condition for defining the scanning speed (rotation speed of the polygon mirror 66) of the spot light SP, an exposure frequency condition for defining the frequency of multiple exposures, a pattern condition (pattern data) for defining a pattern to be drawn, and the like; and a conveying speed condition of the substrate P are set as the setting conditions (second setting conditions) of the processing device PR3. The processing device PR3 performs exposure processing on the substrate P while conveying the substrate P according to the setting conditions. Processing conditions (third processing conditions) including a temperature condition for defining the temperature of the development fluid, a concentration condition for defining concentration of the development fluid, an immersion time condition for defining the immersion time, and the like; and a conveying speed condition of the substrate P are set as the setting conditions (third setting conditions) of the processing device PR4. The processing device PR4 performs development processing on the substrate P while conveying the substrate P according to the setting conditions. Processing conditions including a temperature condition for defining the temperature of the etching fluid, a concentration condition for defining the concentration, an immersion time condition for defining the immersion time, and the like; and a conveying speed condition of the substrate P are set as the setting conditions of the processing device PR5; and the processing device PR5 performs etching processing while conveying the substrate P according to the setting conditions. Note that when a plating processing is performed by the processing device PR4, processing conditions (third processing conditions) including a temperature condition for defining the temperature of the plating fluid, a concentration condition for defining concentration of the plating fluid, an immersion time condition for defining the immersion time, and the like, and a conveying speed condition of the substrate P are set as the setting conditions (third setting conditions) of the processing device PR4. Therefore, the processing device PR4 performs plating processing on the substrate P while conveying the substrate P according to the setting conditions.

The setting conditions of each processing device PR1 to PR5 is preset so that the state of the actual processing (actual processing) applied by each processing device PR1 to PR5 is the target processing state. The setting conditions of each processing device PR1 to PR5 may be stored in a recording medium, not illustrated, provided in each processing device PR1 to PR5, and may be recorded in a recording medium, not illustrated, of the upper control device. Furthermore, in the device manufacturing system 10, since the substrate P is conveyed at a constant speed, the conveying speed condition of the setting conditions set by each processing device PR1 to PR5 is essentially the same speed (for example, a constant speed in the range of 5 mm/second to 50 mm/second).

Each processing device PR1 to PR5 performs processing on the substrate P according to the setting conditions, but in some cases, the state of the actual processing (actual processing) has a processing error E that exceeds the permissible range of the target processing state. For example, since the strength of the laser light LB emitted by the laser light source of the light source device 32 may decrease, and the temperature and concentration of the development fluid and etching fluid may decrease, the state of the actual processing (actual processing) has a processing error E that exceeds the permissible range of the target processing state. For example, since the amount of exposure decreases when the strength of the laser light LB decreases, in the case of a photoresist, a portion of the region where the spot light SP is irradiated, that is, the photosensitive functional layer (photoresist layer) in the outer peripheral portion of a region where the spot light SP is irradiated, is not reformed to the deep portion. Thus, the line width of the pattern formed on the photosensitive functional layer by the developing processing becomes thick relative to the line width (target line width) of the desired pattern. In other words, since the portion where light is irradiated and reformed dissolves due to the development, and the region of the remaining portion of the resist layer (non-reformed portion) remains after being etched as a pattern of the metal layer (conductive) such as a circuit or a wiring for a display panel, the line width of the pattern thickens as the amount of exposure decreases. As a result, the pattern of the metal layer appearing on the substrate P differs from the desired pattern.

When the temperature and concentration of the development fluid is decreased, or when the immersion time of the development fluid is shortened, the reformed portion of the photosensitive functional layer cannot be sufficiently removed by the development fluid. Thus, the line width of the pattern formed on the photosensitive functional layer deviates from the target line width corresponding to the latent image formed on the photosensitive functional layer by the processing device PR4. As a result, the pattern on the metal layer appearing on the substrate P is not the desired pattern.

When the temperature and concentration of the etching fluid is decreased, or when the immersion time of the etching fluid is shortened, etching of the metal thin film (conductive thin film) formed on the lower layer of the photosensitive functional layer by using the photosensitive functional layer in which the pattern is formed as a mask cannot be sufficiently performed. Thus, the line width of the pattern on the metal layer, which the processing device PR5 formed by etching, deviates from the target line width. In other words, since the portion of the metal thin film removed by etching is a pattern such as a circuit or wiring and the like for a display panel, when etching is not sufficiently performed by using the photosensitive functional layer on which the pattern is formed as a mask, the line width of the pattern thickens. As a result, the pattern on the metal layer appearing on the substrate P is not the desired pattern.

Furthermore, when the film thickness of the photosensitive functional layer (photoresist) thickens, since it is difficult to reform the deep portion of the photosensitive functional layer of the region where the spot light SP is irradiated, the line width of the pattern formed on the photosensitive functional layer deviates from the target value due to the removal of the reformed portion by the development fluid. As a result, the pattern on the metal layer appearing on the substrate P is not the desired pattern.

Thus, when any one of the states of actual processing applied by each processing device PR1 to PR5 on the substrate P according to the setting conditions has a processing error E that exceeds the permissible range of the target processing state, the desired pattern of the metal layer does not appear on the substrate P, and the shape or size of the pattern fluctuates. Thus, in the present first embodiment, when at least one of the actual processing states applied on the substrate P in each of the processing devices PR1 to PR5 has a processing error E that exceeds the permissible range of the target processing state, the upper control device 14 changes the setting conditions of the other processing device PR, other than the processing devices PR generating the processing error E, according to the processing error E. The processing error E indicates how much the shape or dimensions of the pattern formed on the substrate P varies with the shape or dimensions of the target pattern.

When the setting conditions exhibiting the processing error E is the setting conditions of the processing device PR3, first the setting conditions of the processing device PR3 is changed so that the processing error does not occur, or so that the processing error falls within the permissible range. Then, when it cannot be supported by only changing the setting conditions of the processing device PR3, the setting conditions of the other processing devices PR (PR1, PR2, PR4, PR5) are further changed so that the processing error does not occur, or so that the processing error falls within the permissible range. At this time, after the change of the setting conditions of the other processing devices PR is completed, the setting conditions of the processing device PR3 may be restored. Furthermore, when the setting conditions exhibiting the processing error E is the setting conditions of a processing device PR other than the processing device PR3, the setting conditions of the processing device PR3 is preferentially changed so that the processing error does not occur, or so that the processing error falls within the permissible range.

The upper control device 14 illustrated in FIG. 1 sets the setting conditions (recipe) to be the target value of the processing in each processing device PR1 to PR5, corrects those setting conditions, and is provided with an operating device for monitoring the processing status of each processing device PR1 to PR5. The operating device is configured with an input device such as a keyboard, mouse, touch panel or the like for inputting data, parameters, commands or the like; and with a monitor device (display) for displaying the setting conditions of each processing device PR1 to PR5, the processing state, generating status of the processing error E, candidates of the processing device PR that can change the setting conditions for correcting the processing error E, information indicating the scale and the like (amount of correction, correction time, and the like) for correction, and information relating to the adjustment of the conveying speed of the substrate P.

Figure 7:
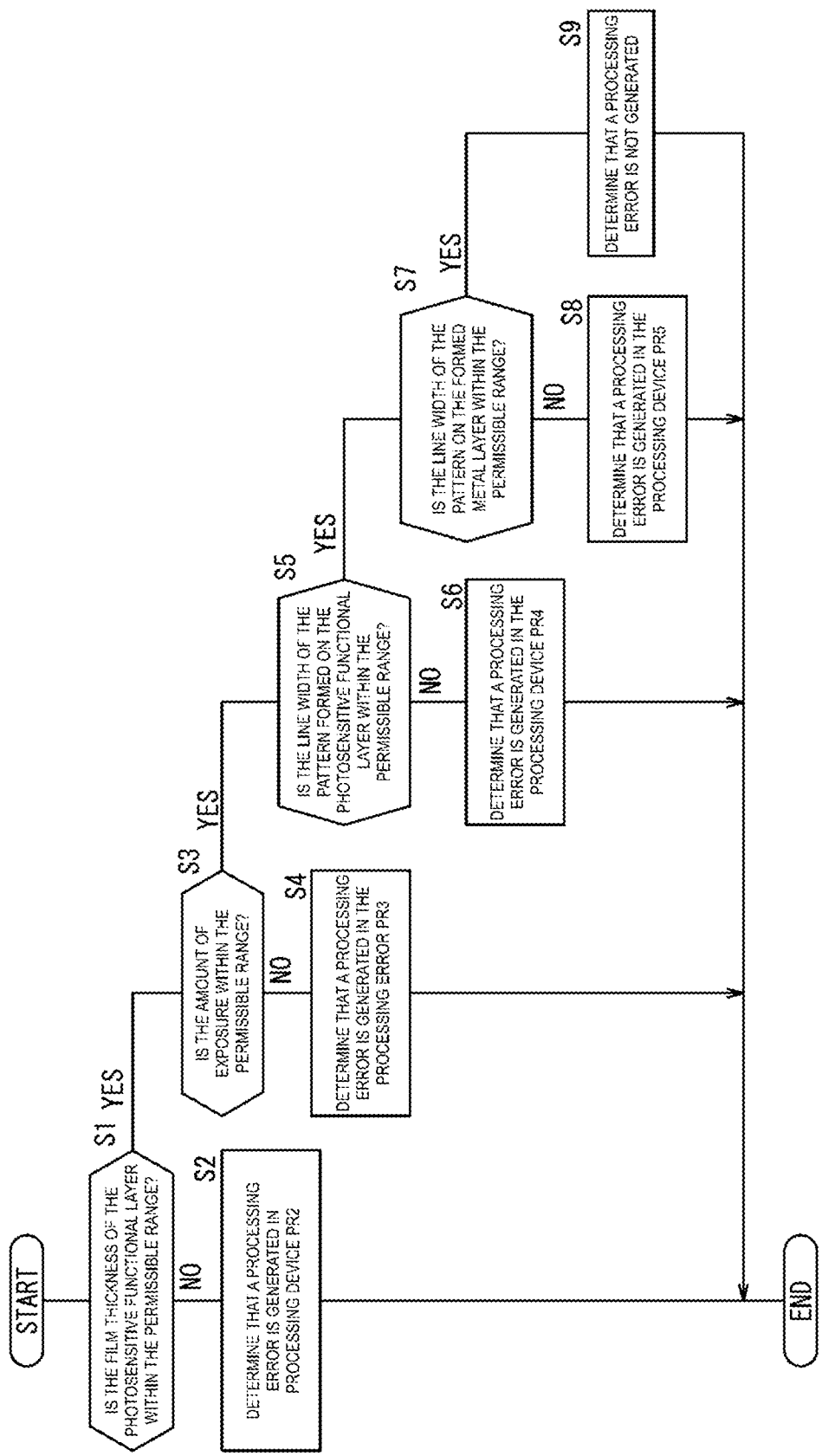
FIG. 7 is a flow chart illustrating the operation of a device manufacturing system for determining a processing device that is generating a processing error exceeding the permissible range.

The operation of the device manufacturing system 10 when any one of the actual processing states applied by each processing device PR1 to PR5 on the substrate P according to the setting conditions has a processing error E that exceeds the permissible range of the target processing state will be described below. FIG. 7 is a flow chart illustrating the operation of the device manufacturing system for determining the processing device PR that is generating the processing error E exceeding the permissible range. First, the upper control device 14 determines whether the film thickness of the photosensitive functional layer is within the permissible range (step S1). In other words, it is determined whether the film thickness of the photosensitive functional layer actually formed is within the permissible range for the film thickness condition set so as to be the target processing state (hereinafter, the target thickness condition). This determination is performed based on the film thickness measured by the film thickness measuring device 16a. That is, in step S1, it senses whether the quality of pattern (fidelity or uniformity and the like of shape and dimension) formed on the substrate P due to the setting conditions of the processing device PR2 exceeds the target permissible range and changes (decreases). In step S1, when determined that the film thickness measured by the film thickness measuring device 16a is not within the permissible range for the target film thickness, the upper control device 14 determines whether the processing error E (E2) is generated exceeding the permissible range in the processing device PR2 (step S2). In other words, it is determined whether the actual processing state applied by the processing device PR2 has a processing error E2 that exceeds the permissible range for the target processing state.

Meanwhile, in step S1, when determined that the film thickness measured by the film thickness measuring device 16a is within the permissible range, the upper control device 14 determines whether the amount of exposure of the laser light LB irradiated on the substrate P by the processing device PR3 is within the permissible range for the target amount of exposure (step S3). The determination is performed by determining whether the strength of the laser light LB detected by the strength sensor 37 is within the permissible range for the strength condition set so as to be the target processing state (hereinafter, target strength condition). In other words, since the line width of the pattern formed on the photosensitive function layer is changed according to the strength of the laser light LB, it is determined whether the amount of exposure is within the permissible range based on the strength of the laser light LB indicating the amount of exposure. Note that in step S3, it may be determined whether there is other information indicating the amount of exposure, for example, whether the scanning speed and the like of the spot light SP is within the permissible range for the scanning speed condition set so as to be the target processing (hereinafter, target scanning speed condition). Furthermore, it may be determined whether the amount of exposure is within the permissible range based on a plurality of information (strength of the laser light LB, scanning speed of the spot light SP, and the like). That is, in step S3, it senses whether the quality of pattern (fidelity or uniformity and the like of shape and dimension) formed on the substrate P due to the setting conditions of the processing device PR3 exceeds the target permissible range and changes (decreases). In step S3, when it is determined that the amount of exposure is not within the permissible range for the target amount of exposure (the processing condition set so as to be the target processing state), the upper control device 14 determines whether the processing error E (E3) is generated exceeding the permissible range in the processing device PR3 (step S4). In other words, it is determined whether the actual processing state applied by the processing device PR3 has a processing error E4 that exceeds the permissible range for the target processing state.

Meanwhile, in step S3, when it is determined that the amount of exposure is within the permissible range, the upper control device 14 determines whether the line width of the pattern formed on the photosensitive functional layer due to the processing device PR4 performing the development processing is within the permissible range (step S5). The upper control device 14 measures the line width of the pattern formed on the photosensitive functional layer based on image data that the imaging device 83 provided in the processing device PR4 imaged. Although the setting conditions of the processing PR4 is defined so that the line width of the pattern formed on the photosensitive functional layer is the target line width in principle, for example, when less than or shorter than the temperature condition (hereinafter, the target temperature condition), the concentration condition (hereinafter, the target concentration condition), or the immersion time condition (hereinafter, the target immersion time condition) set so that the temperature, concentration, or immersion time of the development fluid is the target processing state, the line width of the formed pattern deviates from the target line width. That is, in step S5, it senses whether the quality of pattern (fidelity or uniformity and the like of shape and dimension) formed on the substrate P due to the setting conditions of the processing device PR4 exceeds the target permissible range and changes (decreases). In step S5, when determined that the line width of the pattern formed on the photosensitive functional layer is not within the permissible range, the upper control device 14 determines whether the processing error E (E4) is generated exceeding the permissible range in the processing device PR4 (step S6). In other words, it is determined whether the actual processing state applied by the processing device PR4 has a processing error E4 that exceeds the permissible range for the target processing state.

Meanwhile, in step S5, when it is determined that the line width of the pattern formed on the photosensitive functional layer is within the permissible range, the upper control device 14 determines whether the line width of the pattern on the metal layer appearing on the substrate P due to etching by the processing device PR5 is within the permissible range (step S7). The upper control device 14 measures the line width of the pattern formed on the metal layer based on image data that the imaging device 83 provided in the processing device PR5 imaged. Although the setting conditions of the processing PR5 is defined so that the line width of the pattern on the metal layer is the target line width in principle, for example, when less than or shorter than the temperature condition (hereinafter, the target temperature condition), the concentration condition (hereinafter, the target concentration condition), or the immersion time condition (hereinafter, the target immersion time condition), set so that the temperature, concentration, or immersion time of the etching fluid is the target processing state, the line width of the pattern on the metal layer deviates from the target line width. That is, in step S7, it is detected whether the quality of pattern (fidelity or uniformity and the like of shape and dimension) formed on the substrate P due to the setting conditions of the processing device PR5 exceeds the target permissible range and changes (decreases). In step S7, when it is determined that the line width of the pattern on the metal layer is not within the permissible range, the upper control device 14 determines whether the processing error E (E5) is generated exceeding the permissible range in the processing device PR5 (step S8). In other words, it is determined whether the actual processing state applied by the processing device PR5 has a processing error E4 that exceeds the permissible range for the target processing state. Meanwhile, in step S7, when it is determined that the line width of the pattern on the metal layer is within the permissible range, it is determined that the processing error E is not generated in the processing devices PR2 to PR5 (step S9).

Figure 8:
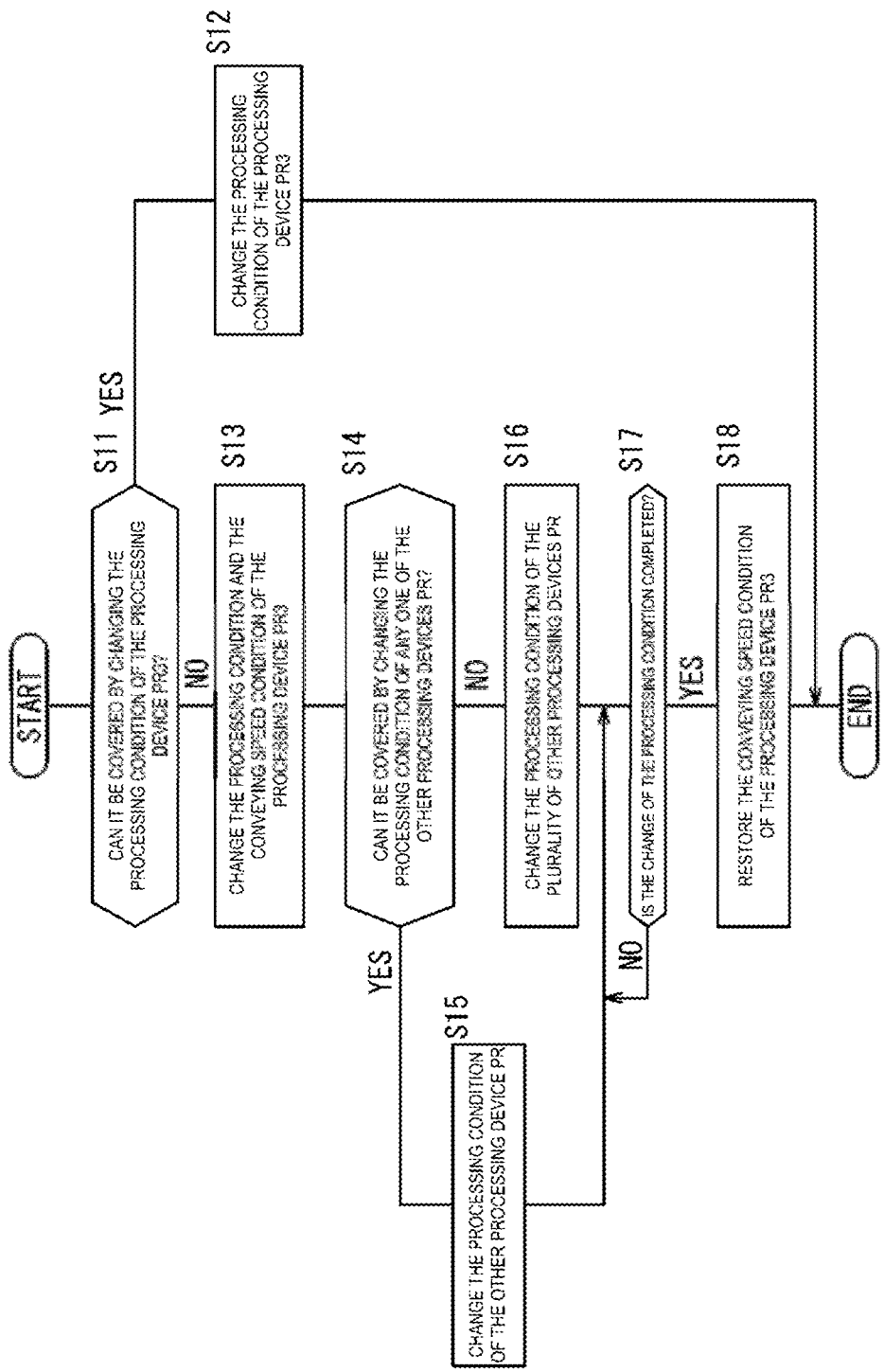
FIG. 8 is a flow chart illustrating the operation of a device manufacturing system when a processing error is generated in a processing device that is an exposure device.

In step S4 of FIG. 7, the operation of the device manufacturing system 10 when it is determined that the processing error E3 is generated exceeding the permissible range in the processing device PR3 is described. FIG. 8 is a flow chart illustrating the operation of the device manufacturing system 10 when the processing error E3 is generated in a processing device PR3. When the processing error E3 is generated in the processing device PR3, the upper control device 14 determines whether the error processing E3 can be covered by changing the processing condition from among the setting conditions of the processing device PR3 (step S11). In other words, it is determined whether the processing error E3 can be eliminated by changing the processing condition or whether the error processing E3 can be kept within the permissible range. For example, when the amount of exposure barely exceeds the permissible range for the target amount of exposure, the amount of exposure needs to be increased to the target amount of exposure, and it is determined whether it can be made to be the target amount of exposure by changing the processing condition. Since the amount of exposure is decided by the strength of the laser light LB, the scanning speed of the spot light SP, and the like, in step S11 it can be determined whether the actual amount of exposure can be increased to the target amount of exposure by changing the strength condition and the scanning speed condition or the like.

In step S11, when it is determined that it can be covered by changing the processing condition, the upper control device 14 changes the processing condition (strength condition or scanning speed condition, pattern condition and the like) of the setting conditions of the processing device PR3 according to the processing error E3 (step S12). Meanwhile, in step S11, when it is determined that it cannot be covered by only changing the processing condition, the upper control device 14 changes the processing condition of the processing device PR3 and the conveying speed condition according to the processing error E3 (step S13). For example, when the amount of exposure barely exceeds the permissible range for the target amount of exposure, the processing condition is changed and the conveying speed condition is changed so that the conveying speed of the substrate P slows down. The amount of exposure can be increased by slowing down the conveying speed condition. Note that from among the processing errors E3, the processing error that can be covered by changing the processing condition is E3$a$, and the processing error that can be covered by changing the conveying speed condition is E3$b$. Therefore, E3=E3$a$+E3$b$. When the processing error E3 can be covered by changing only the processing condition, E3$a$=E3, and E3$b$=0. Furthermore, when the processing condition cannot be changed, for example, when the preset strength condition is the maximum strength, or the like, only the conveying speed condition can be changed according to the processing error E3. In this case, E3$a$=0, and E3$b$=E3.

Here, although the processing devices PR1 to PR5 conveys the substrate P at a constant speed, since the processing device PR3 is provided between the first storage device BF1 and the second storage device BF2, the conveying speed of the substrate P in the processing device PR3 can be independently changed. In other words, the difference of the conveying speed between the conveying speed of the processing device PR3 and the processing device PR other than a processing device PR3 can be absorbed by the first storage device BF1 and the second storage device BF2. When the conveying speed of the substrate P in the processing device PR3 is conveyed slower than the constant speed, the amount of storage of the substrate P in the first storage device BF1 is gradually increased, and the amount of storage of the second storage device BF2 is gradually decreased. Conversely, when the conveying speed of the substrate P in the processing device PR3 is conveyed faster than the constant speed, the amount of storage of the substrate P in the first storage device BF1 is gradually decreased, and the amount of storage of the second storage device BF2 is gradually increased. When the storage length of the first storage device BF1 or the second storage device BF2 is less than or equal to a predetermined storage length, since the substrate P is not additionally stored in the first storage device BF1 or the second storage device BF2, the conveying speed of the substrate P in the processing device PR3 cannot be independently changed. Thus, even though the conveying speed of the substrate P in the processing device PR3 can be temporarily changed, the conveying speed of the substrate P cannot be changed for more than a certain amount of time.

Thus, it is necessary to restore the conveying speed of the substrate P in the processing device PR3 to keep the storage length of the first storage device BF1 and the second storage device BF2 within a predetermined range. Thus, in step S13, when the processing condition and the conveying speed condition of the processing device PR3 is changed, the upper control device 14 determines whether the processing error E3$b$ generated when the conveying condition of the processing device PR3 is restored can be covered (interpolated) by changing the processing condition of any one of the other processing devices PR (step S14). In other words, when the conveying speed of the processing device PR3 is restored, since the amount of exposure is decreased, it is determined whether the line width of the pattern can be set to the target line width by compensating for defects caused by the other processing devices PR.

In step S14, when determined that the processing condition of any one of the other processing devices PR can be covered by changing according to the processing error E3$b$, the processing condition of the other processing device PR, wherein it was determined that it could be covered, is changed according to the processing error E3$b$ generated when the conveying speed of the processing device PR3 is restored (step S15), and then proceeds to step S17. For example, when the other processing device PR, wherein it was determined that it can be covered by changing the processing condition, is the processing device PR2, the processing condition (film thickness condition and the like) of the processing device PR2 is changed according to the processing error E3$b$ (for example, insufficient exposure) generated when the conveying speed condition of the processing device PR3 is restored. When the processing error E3$b$ is due to insufficient exposure, since it is reformed to the deep portion of the photosensitive functional layer even though the amount of exposure becomes smaller as the film thickness becomes thinner, the processing error E3$b$ (insufficient exposure) generated when the conveying speed condition of the processing device PR3 is restored can be covered by thinning the thickness of the film thickness condition. As a result, the line width of the pattern formed on the photosensitive functional layer and the line width of the pattern on the metal layer whereon it appears can be set to the target line width due to the development processing.

When the other processing device PR, wherein it was determined that it can be covered by changing the processing condition, is the processing device PR4, the processing condition (temperature condition, concentration condition, immersion time condition) of the processing device PR4 is changed according to the processing error E3$b$ generated when the conveying speed condition of the processing device PR3 is restored. For example, since the region in which the photosensitive functional layer is dissolved and removed widens for as high as the temperature and concentration of the development fluid, and as long as the immersion time in which the substrate P is immersed in the development fluid, the photosensitive functional layer can be removed to the deep portion. Therefore, when the processing error E3 is due to insufficient exposure, the processing error E3b (insufficient exposure) generated when the conveying speed condition of the processing device PR3 is restored can be covered, and the line width of the pattern can be the target line width by increasing or lengthening at least one of the temperature condition, the concentration condition, and the immersion time condition. The lower control device 80 of the processing device PR4 controls heaters H1 and H2 of the processing device PR4 according to the temperature condition, and moves the movable arm 84 of the processing device PR4 according to the immersion time condition. Furthermore, the development fluid in the processing tank BT is recovered and a circulation system for supplying a new development fluid to the process tank BT is provided in the processing tank BT of the processing device PR4, and the lower control device 80 of the processing device PR4 changes the concentration of the development fluid supplied to the processing tank BT according to the concentration condition.

When the other processing device PR, wherein it was determined that it can be covered by changing the processing condition, is the processing device PR5, the processing condition (temperature condition, concentration condition, immersion time condition) of the processing device PR5 is changed according to the processing error E3b generated when the conveying speed condition of the processing device PR3 is restored. For example, although the metallic think film formed on the lower layer of the photosensitive functional layer is etched by using the photosensitive functional layer whereon the pattern as a mask is formed, the etched portion can be widened as much as the temperature and concentration of the etching fluid is high, and as the immersion time wherein the substrate P is immersed in the etching fluid is long. Therefore, when the processing error E3 is due to insufficient exposure, the processing error E3b (insufficient exposure) generated when the conveying speed condition of the processing device PR3 is restored can be covered, and the line width of the pattern can be the target line width by increasing or lengthening at least one of the temperature condition, the concentration condition, and the immersion time condition of the etching fluid. The lower control device 80 of the processing device PR5 controls the heaters H1 and H2 of the processing device PR5 according to the temperature condition, and moves the movable arm 84 of the processing device PR5 according to the immersion time condition. Furthermore, the etching fluid in the processing tank BT is recovered and a circulation system for supplying a new etching fluid to the processing tank BT is provided in the processing tank BT of the processing device PR5, and the lower control device 80 of the processing device PR5 changes the concentration of the development fluid supplied to the processing tank BT according to the concentration condition.

Here, it is conceivable to cover the processing error E3b generated in the processing device PR3 by changing the processing condition of the other processing device PR other than the processing device PR3 from the beginning without changing the conveying speed condition of the processing device PR3. However, in the processing device PR3 (patterning device such as an exposure device EX), the actual processing state can be changed instantaneously when the processing condition changes, but in other processing devices PR (mainly a wet-type processing device) other than the processing device PR3, even if the processing condition is changed, it takes some time for the actual processing state to become the target processing state determined by the processing condition after being changed, and the processing error E3b generated by the processing device PR3 cannot be quickly covered. For example, the film thickness of the photosensitive functional layer whereon the substrate P is deposited is gradually changed as the time elapses even when the processing condition (film thickness condition and the like) of the processing device PR2 is changed. Furthermore, the temperature, concentration, and immersion time of the development fluid and the etching fluid is gradually changed as the time elapses even when the processing condition (temperature condition, concentration condition, immersion time condition) of the processing devices PR4 and PR5 is changed. Thus, the processing error E3b is handled by gradually changing the conveying speed of the substrate P of the processing device PR3 until the actual processing state of the other processing devices PR becomes the target processing state determined by the processing condition after being changed. After the processing condition of the other processing devices PR is changed, since the actual processing state gradually approaches the target processing state determined by the processing condition after being changed due to the other processing devices, the upper control device 14 thereby gradually restores the conveying speed condition of the substrate P in the processing device PR3. The upper control device 14 gradually approaches the conveying speed condition prior to changing the conveying speed condition of the substrate P in the processing device PR3 based on the detection results of the film thickness measuring device 16a, the temperature sensor Ts, the concentration sensor Cs, the position sensor 87, and the like.

Note that when there is a plurality of processing devices PR wherein the processing error E3b generated when restoring the conveying speed condition of the processing device PR3 can be covered, the processing condition of the processing device PR near the processing device PR3 may be changed. For example, in the case of the processing device PR2 and PR5, the processing device PR wherein the processing error E3b generated when restoring the conveying speed condition of the processing device PR3 can be covered, may change the processing condition of the processing device PR2 near the processing device PR3. Furthermore, in step S14, although it is determined whether the processing error E3b generated when restoring the conveying speed condition of the processing device PR3 can be covered by the other processing devices PR, it may also be determined whether the processing error E3b generated in the processing device PR3, that is, the processing error E3b generated when restoring the processing condition and the conveying speed condition of the processing device PR3 can be covered by the other processing devices PR. At this time, in step S15, the processing error E3 generated in the processing device PR4 can be covered by changing the processing condition of the other processing devices PR wherein is was determined that it could be covered. In this case, after the processing condition of the other processing devices PR is changed, since the actual processing state gradually approaches the target processing state determined by the processing condition after being changed due to the other processing devices PR, the upper control device 14 thereby also gradually restores the processing condition in addition to the conveying speed condition of the substrate P in the processing device PR3.

Meanwhile, in step S14, when determined that the processing error E3b (for example, insufficient exposure) generated when restoring the conveying speed direction of the processing device PR3 cannot be covered by only changing the processing condition of the any one of the other processing devices PR, the upper control device 14 changes the processing condition of the plurality of other processing devices PR according to the processing error E3*b* generated when restoring the conveying speed condition of the processing device PR3 (step S16), and then proceeds to step S17. In this case, since the actual processing state of the plurality of other processing devices PR approaches the target processing state determined by the processing condition after being changed as time has elapsed, the upper control device 14 thereby gradually restores the conveying speed condition of the substrate P in the processing device PR3.

Note that the processing condition of the plurality of other processing devices PR may be changed according to the processing error E3 generated in the processing device PR3. In this case, after the processing condition of the plurality of other processing devices PR is changed, since the actual processing state gradually approaches the target processing state determined by the processing condition after being changed, the upper control device 14 thereby also gradually restores the processing condition in addition to the conveying speed condition of the substrate P in the processing device PR3.

When proceeding to step S17, the upper control device 14 determines whether the change of processing condition is completed. In other words, it is determined whether the actual processing state becomes the target processing state determined by the processing condition after being changed due to the processing device PR wherein the processing condition was changed in step S15 or S16. This determination is performed based on the detection results of the film thickness measuring device 16*a*, the temperature sensor Ts, the concentration sensor Cs, the position sensor 87, and the like. In step S17, when determined that the change of the processing condition is not completed, it remains at step S17, and when determined that the change of the processing condition is completed, the conveying speed condition of the processing device PR3 is restored (step S18). Note that when the processing error E3 generated in the processing device PR3 is covered by the other processing devices PR, the processing condition is also restored in addition to the conveying speed condition of the processing device PR3.

Note that in step S16, when the processing error E3*b* of the processing device PR3 cannot be covered, even when changing the processing condition of the plurality of other processing devices PR, it is determined whether the conveying speed condition of the plurality of other processing devices PR can be changed, and when it can be changed, it may be changed so that the conveying speed condition of all processing devices PR1 to PR5 are the same. For example, the conveying speed condition of the processing devices PR1, PR2, PR4, and PR5 may be changed so as to be the same as the conveying speed condition of the processing device PR3.

Figure 9:
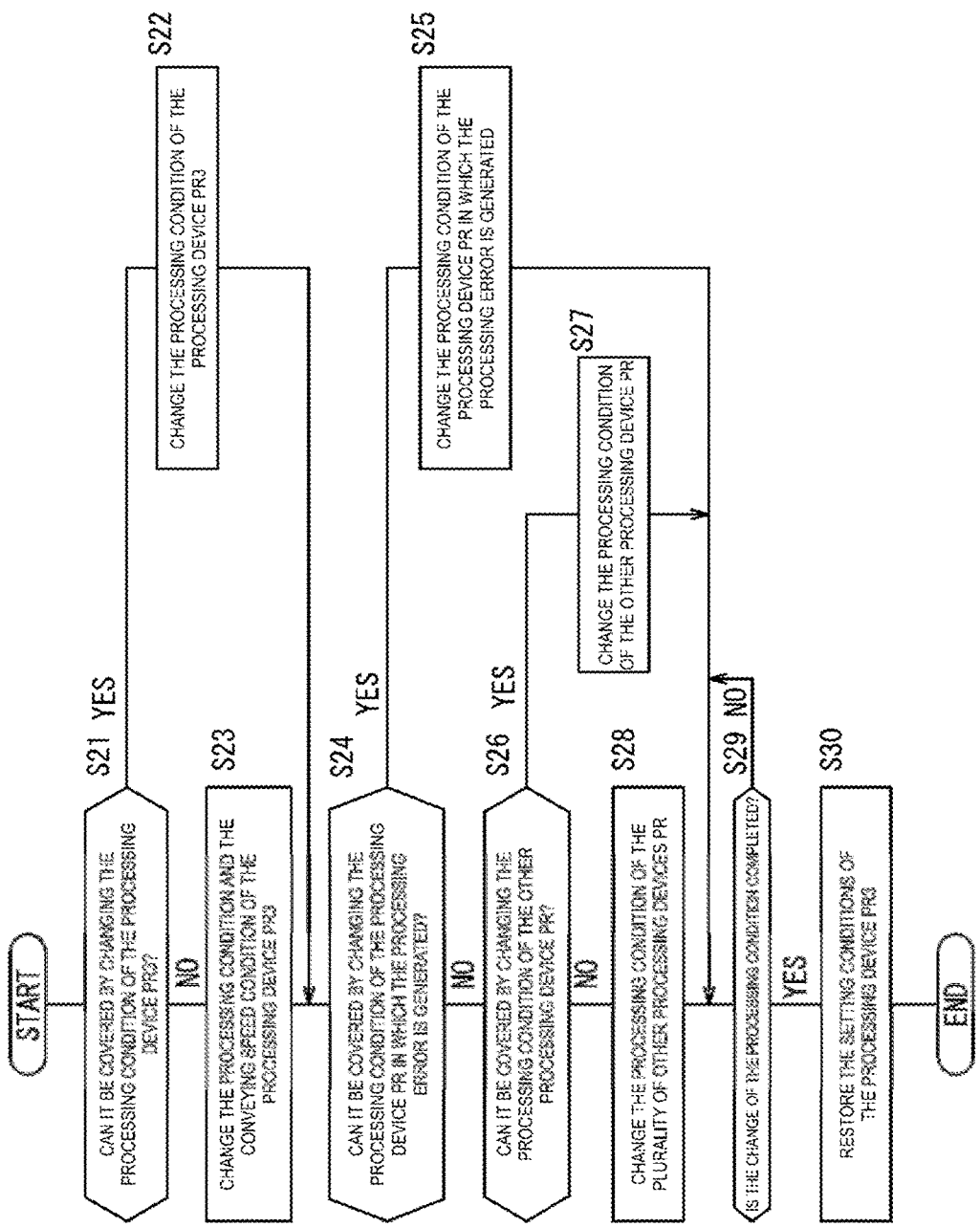
FIG. 9 is a flow chart illustrating the operation of a device manufacturing system when a processing error is generated in a processing device other than a processing device that is an exposure device.

Next, the operation of the device manufacturing system when determined that the processing error E (E2, E4, or E5) is generated exceeding the permissible range of the processing devices PR (PR2, PR4, or PR5) other than the processing device PR3 will be described by step S2, S6, or S8 of FIG. 7. FIG. 9 is a flow chart illustrating the operation of the device manufacturing system when the processing error E3 is generated in the processing device PR3 other than a processing device PR. The upper control device 14 determines whether the processing error E (E2, E4, or E5) can be covered by changing the processing condition of the processing devices PR3 when the processing error E (E2, E4, or E5) is generated in the processing devices PR other than the processing device PR3. For example, in the case where the other processing devices PR in which the processing error E is generated is the processing devices PR2, when the film thickness of the photosensitive function layer actually formed is thinner than the target film thickness, since the line width of the patter formed on the photosensitive functional layer by the processing devices PR4 becomes thicker, it is determined whether the line width of the pattern formed on the photosensitive functional layer by increasing the amount of exposure can become the target line width. Furthermore, in the case where the other processing devices PR in which the processing error E is generated is the processing devices PR4 and PR5, when the temperature, concentration, or immersion time of the actual development fluid and etching fluid is less than or shorter than the target temperature condition, concentration condition, or immersion time condition, since the line width of the pattern formed on the photosensitive functional layer and the pattern on the metal layer becomes thicker, it is determined whether the line width of the pattern formed on the photosensitive functional layer by increasing the amount of exposure and the pattern on the metal layer can become the target line width by changing the processing condition of the processing devices PR3.

In step S21, when determined that it can be supported by changing the processing condition of the processing device, the upper control device 14 changes the processing condition (strength condition or scanning speed condition, pattern condition and the like) of the processing device PR3 according to the processing error E (E2, E4, or E5) (step S22). Meanwhile, in step S21, when determined that it cannot be supported by changing the processing condition, the upper control device 14 changes the processing condition of the processing device PR3 and the conveying speed condition according to the processing error E (E2, E4, or E5) (step S23). Note that when the processing condition cannot be changed, for example, when the preset strength condition is the maximum strength, or the like, only the conveying speed condition can be changed according to the processing error E (E2, E4, or E5).

Next, the upper control device 14 determines if the processing error E (E2, E4, or E5) can be covered even when the setting conditions of the processing devices PR3 is restored, by changing the processing condition of the processing device PR (PR2, PR4, or PR5) wherein the processing error E (E2, E4, or E5) is generated (step S24). In other words, it is determined whether the processing error E generated when the setting conditions of the processing device PR3 is restored can be eliminated by changing the processing condition of the processing device PR wherein the processing error E is generated. For example, when the processing device PR generating the processing error E is the processing device PR2, it is determined whether the film thickness condition can be changed according to the processing error E2 when the film thickness of the photosensitive functional layer that is actually formed exhibits the processing error E2 of the target film thickness condition. Furthermore, in the case where the other processing devices PR in which the processing error E is generated is the processing devices PR4 and PR5, when the temperature, concentration, or immersion time of the actual development fluid and etching fluid exhibits the processing error E4 and E5 of the target temperature condition, concentration condition, or immersion time condition, it is determined whether the temperature condition, concentration condition, or immersion time condition can be changed according to the processing error E4 and E5.

In step S24, when determined that the processing error E can be covered even when the setting conditions of the processing device PR3 is restored by changing the processing condition of the processing device PR in which the processing error E is generated, the upper control device 14 changes the processing condition of the processing device PR generating the processing error E (step S25). For example, when the other processing device PR in which the processing error E is generated is the processing device PR2, when the film thickness of the photosensitive functional layer actually formed is thin for the target film thickness condition, the setting conditions is thickened according to the processing error E2. Furthermore, in the case where the processing device PR in which the processing error E is generated is the processing devices PR4 or PR5, when at least one processing condition of the temperature, concentration, and immersion time of the actual development fluid and etching fluid is less than or shorter than the target temperature condition, concentration condition, or immersion time condition, then at least one processing condition of the temperature condition, concentration condition, or immersion time condition is increased or made longer according to the processing error E4 or E5. In this case, since the actual processing state of the processing device PR generating the processing error E changes as the time elapses, the upper control device 14 thereby gradually restores the setting conditions of the processing device PR3.

Meanwhile, in step S24, when determined that the processing condition of the processing device PR (PR2, PR4, or PR5) in which the processing error E (E2, E4, or E5) is generated cannot be eliminated, the upper control device 14 determined if the processing error E can be covered by changing the processing condition of the other processing devices PR (except the processing device PR3) (step S26). For example, when the processing device PR generating the processing error E is the processing device PR2, it is determined whether the processing error E2 can be covered by changing processing condition of the processing device PR4 or PR5 when the film thickness of the photosensitive functional layer that is actually formed exhibits the processing error E2 that exceeds the permissible range of the target film thickness condition. When the film thickness of the photosensitive functional layer actually formed is thicker than the target film thickness condition, since the line width of the pattern becomes thicker, it is determined whether the line width of the pattern can become the target line width by increasing or lengthening the temperature, concentration, and immersion time of the development fluid or etching fluid.

In step S26, when determined that it can be supported by changing the processing condition of the other processing device PR, the upper control device 14 changes the processing condition of the other processing device PR according to the processing error E (step S27), and proceeds to step S29. For example, in the case where the processing device PR generating the processing error E is the processing device PR2, when the film thickness of the photosensitive functional layer actually formed is thicker than the target film thickness condition, at least one processing condition of the temperature condition, concentration condition, and immersion time of the processing devices PR4 and PR5 is increased or lengthened according to the processing error E2. In this case, since the actual processing state of the other processing devices PR approaches the target processing state determined by the processing condition after being changed as time has elapsed, the upper control device 14 thereby gradually restores the setting conditions of the processing device PR3.

Meanwhile, in step S26, when determined that that it cannot be supported even by changing the processing condition of the other processing devices PR, the upper control device 14 changes the processing condition of the plurality of other processing devices PR other than the processing device PR3 according to the processing error E (step S28), and proceeds to step S29. In this case, since the actual processing state of the plurality of the other processing devices PR approaches the target processing state determined by the processing condition after being changed as time has elapsed, the upper control device 14 thereby gradually restores the setting conditions of the processing device PR3.

When proceeding to step S29, the upper control device 14 determines whether the change of processing condition is completed. In other words, it is determined whether the actual processing state becomes the target processing state determined by the processing condition after being changed due to the processing device PR wherein the processing condition was changed in step S25, S27, or S28. This determination is performed based on the detection results of the film thickness measuring device 16a, the temperature sensor Ts, the concentration sensor Cs, the position sensor 87, and the like. In step S29, when determined that the change of the processing condition is not completed, it remains at step S29, and when determined that the change of the processing condition is completed, the setting conditions of the processing device PR3 is restored (step S30).

Note that in step S22, when only the processing condition of the processing device PR3 is changed, the operation illustrated in FIG. 9 may be completed similar to the operation illustrated in FIG. 8. In other words, in this case, the operation of steps S24 to S30 are unnecessary. Furthermore, in step S30, although the setting conditions of the processing device PR3 is restored, the conveying speed condition of the processing device PR3 may be the only thing restored. In the case, in step S25, S27, or S28, the processing condition is changed according to the processing error that generates when only the conveying speed condition of the processing device PR3 is restored.

Thus, when the actual processing state (actual processing results) due to the processing device PR of any one of the processing devices PR2 to PR5 has the processing error E for the target processing state (design value), since the setting conditions of the other processing devices PR can be dynamically changed according to the processing error E, it is possible to continuously manufacture an electronic device of stable quality without stopping the manufacture line. Furthermore, in a patterning device such as an exposure device (drawing device) EX or an inkjet printing device, overlapping exposure and overlapping printing is performed on a pattern of an underlying layer already formed on the substrate P, as the processing device PR. The overlapping precision is particularly important when creating a layer structure of a thin film transistor (gate electrode layer, insulating device, semiconductor layer, source/drain electrode layer) and the like. For example, in the layer structure of the thin film transistor, the relative overlapping precision between layers and the fidelity of the pattern dimensions (line width reproducibility) depends on the performance (positioning precision, amount of exposure, amount of ink discharge, and the like) of the patterning device. The performance of the patterning device, in general, gradually deteriorates, unless it suddenly deteriorates significantly due to some serious trouble. According to the first embodiment, since the state of the patterning device that gradually deteriorates as such is monitored and the processing condition of the other processing devices PR is adjusted, when the performance of the patterning device fluctuates within the permissible range, or even when reaching outside of the permissible range, the dimension (line width) precision of the pattern finally formed on the substrate P can be kept within the target range.

Note that in the present first embodiment, the conveying speed of the substrate P on the processing device PR3 can be freely changed by disposing the first storage device BF1 and the second storage device BF2 before or after the processing device PR3, for example, the first storage device BF1 and the second storage device BF2 may be disposed before and after the processing device PR2 or the processing device PR4 so that the conveying speed of the substrate P on the processing device PR2 or the processing device PR4 may be freely changed. Furthermore, for example, the conveying speed of the substrate P in a plurality of processing devices PR can be freely changed by disposing the first storage device BF1 and the second storage device BF2 before and after a plurality of processing devices PR. Thus, changing the conveying speed condition of each of the plurality of the processing devices PR means that the actual processing state of each processing device PR is changed. For example, in relation to the processing device PR2, even without changing the processing condition including the film thickness condition, the film thickness of the formed photosensitive functional layer is thickened by slowing down the conveying speed condition. Conversely, the film thickness of the formed photosensitive functional layer can become thinner by speeding up the conveying speed condition. Furthermore, in relation to the processing devices PR4 and PR5, even without changing processing condition such as the immersion time condition, the time that the substrate P is immersed in the development fluid or the etching fluid can be effectively lengthened by slowing down the conveying speed condition. Conversely, the time that the substrate P is immersed in the development fluid or the etching fluid can be effectively shortened by speeding up the conveying speed condition. In this case as well, the setting of the conveying speed condition for each processing device PR is changed so that the storage length of both the first storage device BF1 and the second storage device BF2 is kept within a predetermined range.

Furthermore, in step S3 of FIG. 7, it is determined whether the amount of exposure is within a permissible range, and it may be determined whether the line width of the pattern formed on the photosensitive functional layer is within a permissible range. In this case, when determined that the line width of the pattern is not within a permissible range, it is determined if the processing error E3 is generated in the processing device PR3 in step S4, and if it is determined that the line width of the pattern is within a permissible range, step S5 is skipped and it proceeds to step S7. Therefore, in this case, the operation of step S5 and step S6 is unnecessary. Although the line width of the pattern is changed according the condition of the development processing, since it is considered that the line width of the pattern changes significantly according to the actual processing state of the processing device PR3, it is determined whether the processing error E3 is generated in the processing device PR3 based on the line width of the pattern formed on the photosensitive functional layer.

Furthermore, the line width change of the pattern formed on the photoresist layer after development is relatively sensitive to the change of amount of exposure and change in thickness of the resist layer, and has linearity. In contrast, the photosensitive functional layer on a photosensitive silane coupling material or the like is changed from a non-reformed state to a reformed state depending on whether a constant amount of exposure (illuminance) is applied, essentially irrespective of the thickness. Thus, it is actually difficult to correct the line width by adjusting the thickness of the photosensitive functional layer or by adjusting the amount of exposure. However, when a more than necessary amount of exposure is applied, there is a tendency for the line width of the portion to be reformed to become slightly thicker. Therefore, when using a photosensitive functional layer such as a photosensitive silane coupling material or the like, for example, it is effective to correct the condition of the plating processing and correct (correct drawing data) the line width itself of the pattern when exposing the photosensitive functional layer, to the design value based on the measured value of the line width of the metallic pattern precipitated after the plating processing.

As described above, according to the first embodiment of the present invention, among the plurality of processing devices PR, when there is a processing device PR in which the actual processing state is generating the processing error E of the target processing state, since the setting conditions of the other processing devices PR are changed according to the processing error E, it is possible to continuously manufacture an electronic device without stopping the manufacture line. That is, in the process of sequentially forming the layer structure and the pattern shape of the electronic device on the sheet substrate P using a plurality of processing devices PR, even when the actual processing result by a specific processing device PR generates an error in the preset setting conditions (design value), the specific processing device PR itself not only controls itself to suppress the error, but the other processing devices PR disposed on the upstream side or downstream side with respect to the specific processing devices dynamically changes the processing condition so as to effectively cancel or suppress the defect caused by the error. Thus, it is possible to greatly suppress the probability of processing interruption of the processing device PR and temporary stoppage of the entire manufacture line caused by errors generated by some process in the manufacture line.

Furthermore, the first embodiment of the present invention is not limited to a manufacturing line in which three different processing devices PR (processing portions) are always aligned in the conveying direction (length direction) of the substrate P, but can be applied as long as at least two processing devices PR (processing portions) for sequentially processing the substrate P are aligned. In that case, each of the processing conditions in the two processing devices PR may be dynamically adjusted, or the conveying speed of the substrate P in each of the two processing devices PR may be temporarily changed in order to effectively cancel or suppress a defect (line width change or the like) caused by an error generated from the preset setting conditions. In this case, the two processing devices PR (processing portions) applied by the first embodiment do not necessarily need to be disposed one after the other in the conveying direction (length direction) of the substrate P, but may be configured having at least one other processing device PR (processing portion) disposed between two processing devices PR (processing portion) applied by the first embodiment. For example, when performing the development processing after the exposure processing, in the first embodiment, the substrate P is immediately sent to the development portion via the exposure portion, but when developing after performing a post-bake processing in which a photoresist layer is heated at a relatively high temperature after exposure, a heating device (heating portion) and the like for the post-bake processing may correspond to the other processing device PR.

Note that in the first embodiment, in order to simplify the description, a description is given by example where one processing device PR wherein the actual processing state exhibits a processing error E that exceeds the permissible range for the target processing state, but it may also have two or more processing devices PR wherein the actual processing state exhibits a processing error E that exceeds the permissible range for the target processing state. In this case, as described above, when the processing devices PR in which the processing error E occurs does not include the processing devices PR3, the setting conditions of the processing device PR3 is preferentially changed. Furthermore, when the processing device PR generating the processing error E includes the processing device PR3, first, the setting conditions of the processing device PR3 is changed.

Variation of the First Embodiment

The first embodiment may be varied as described below.

Variation 1

In the first embodiment described above, each of the plurality of processing devices PR (PR1 to PR5) disposed in the device manufacture system (manufacture line) illustrated in FIG. 1 can adjust the conveying speed of the sheet-shaped substrate P passing through each processing device during the processing operation according to the adjustment of the processing condition or the setting conditions of each processing device PR. However, the conveying speed of the substrate P passing through each processing device PR is made constant for each processing device PR, and it may be configured so that the excess or deficiency of the amount of conveying (conveying length) of the substrate P caused by the difference in conveying speed of the substrate P between the processing devices PR is absorbed by the first storage device BR1 or the second storage device BR2 provided between the processing device PR. In such a configuration, the permissible range in the difference of conveying speed for the substrate P between the processing devices PR is roughly determined by the total length Lf of the substrate P to be continuously processed, and the maximum storage length of the first storage device BF1 or the second storage device BF2.

For example, the conveying speed of the substrate P in the processing device PR2 on the upstream side of the first storage device BF1 is Va, the conveying speed of the substrate P in the processing device PR3 (patterning device such as the exposure device EX) on the downstream side of the first storage device BF1 (that is, upstream side of the second storage device BF2) is Vb, and the conveying speed of the substrate P in the processing device PR4 (or processing device PR5 on the downstream side of the second storage device BF2 is Vc. In this case, when the required storage length Lac1 of the first storage device BF1 required during continuous processing of the substrate P over the total length Lf has a relationship between conveying speeds Va and Vb where Va>Vb, Lac1=Lf (1−Vb/Va), and when Vb>Va, Lac1=Lf (1−Va/Vb). Similarly, when the required storage length Lac2 of the first storage device BF2 required during continuous processing of the substrate P over the total length Lf has a relationship between conveying speeds Vb and Vc where Vb>Vc, Lac2=Lf (1−Vc/Vb), and when Vc>Vb, Lac2=Lf (1−Vb/Vc).

Thus, if the target conveying speeds Va, Vb, and Vc of the substrate P appropriately set under processing conditions of each of the processing devices PR2 to PR4 are determined, from the above calculation, the required storage length Lac1 of the first storage device BF1 and the required storage length Lac2 of the second storage device BF2 are obtained, and the maximum storage length of each of the first storage device BF1 and the second storage device BF2 are adjusted so that the required storage length Lac1 and Lac2 can be secured. The adjustment of the maximum storage length can be performed by causing the number of times (number of dancer rollers 20 and 22 supporting the substrate P) for folding the substrate P to differ between the plurality of dancer rollers 20 in the first storage device BF1 in FIG. 3, and the plurality of dancer rollers 22 in the second storage device BF2. Reducing the number of time for folding the substrate P by the dancer rollers 20 and 22 is preferable since it reduces the possibility of damaging the thin film layer and the pattern for the electronic device formed on the substrate P, and the possibility of adhering to a foreign substance (dust). Furthermore, the position of the individual dancer rollers 20 and 22 can be changed according to the maximum storage length. In other words, by individually moving each of the dancer rollers 20 and 22 in the Z direction, an actuator that can adjust the position is provided in the first storage device BF1 and the second storage device BF2. The actuator is controlled by the upper control device 14 or the lower control device 24.

Note that the first storage device BF1 illustrated in FIG. 3 (similar to the second storage device BF2) can be configured to be removable as a single unit or to be expandable in tandem (in series). Therefore, when the necessary storage length Lac1 (Lac2) obtained by the calculation above becomes long, the maximum storage length of the substrate P can be easily increased by connecting a plurality of first storage devices BF1 (second storage devices BF2) in tandem. Thereafter, the tip end of the substrate P drawn out from a supply roll FR1 sequentially passes through the processing devices PR1 to PR5 and the storage devices BF1 and BF2, and is wound around a collection roll FR2, and after the storage length of the substrate P in the storage devices BF1 and BF2 are set, the processing operation (conveying of the substrate P at conveying speeds Va, Vb, and Vc) are started by the processing devices PR1 to PR5. Also in the case of variation 1, while each of the processing devices PR2 to PR4 continue to convey the substrate P at a set constant conveying speed Va, Vb, and Vc, when the quality of the pattern formed on the substrate P, for example, is sensed to be changing (decreasing) based on the image data analysis results of the pattern due to the imaging device 83 in FIG. 6, a determination of whether the processing condition (setting conditions) other than the conveying speed of each of the processing devices PR2 to PR4 can be changed, identification of the processing device PR in which the processing condition can be changed, and the calculation of degree the condition can be changed, for example, is appropriately performed by the upper control device 14. The upper control device 14 instructs the specified processing device PR of the changed content in the setting conditions, the changed timing, and the like. Thus, quality (such as fidelity and uniformity of shape and dimensions) of a pattern and the like for an electronic device formed on the substrate P can be kept within a predetermined permissible range over the total length Lf of the substrate P.

Variation 2

When the first storage device BF1 (second storage device BF2) is not increased, since the maximum total length of one of the first storage devices BF1 (second storage devices BF2) is limited, if the total length Lf of the substrate P to be continuously processed is long or the ratio Va:Vb (Vb:Vc) of the conveying speed is large, the storage length of the substrate P in the first storage device BF1 (second storage device BF2) becomes full or the storage length becomes zero during the continuous processing over the total length Lf. Thus, in variation 2, the conveying speeds Va, Vb, and Vc of the substrate P in each of the processing devices PR2 to PR4 are preset so as to perform continuous processing of the substrate P over the total length Lf without being delayed (temporarily stopped) based on a maximum storage length Lm1 and Lm2 of the predetermined first storage device BF1 and second storage device BF2. That is, each of the conveying speeds Va, Vb, and Vc are preset so that the maximum total length Lm1 of the first storage device BF1 satisfies the condition of Lm1>Lf (1−Vb/Va), or Lm1>Lf (1−Va/Vb), and the maximum total length Lm2 of the second storage device BF2 satisfies the condition of Lm2>Lf (1−Vc/Vb), or Lm2>Lf (1−Vb/Vc).

Also, each of the processing devices PR2 to PR4 preadjust the setting conditions of each portion so as to perform the optimal processing at the conveying speeds Va, Vb, and Vc of the set substrate P. While the substrate P of at least the total length Lf is continuously processed, that is, while each of the processing devices PR2 to PR4 continuously convey the substrate P at a set conveying speed Va, Vb, and Vc, in the case that it is sensed that the quality of the pattern formed on the substrate P tends to decrease, the substrate P can be processed while appropriately performing, for example, a determination of whether the processing condition (setting conditions) other than the conveying speed of each of the processing devices PR2 to PR4, identification of the processing device PR that can change the processing condition, calculation of the degree the condition is to be changed, and the like, using the upper control device 14. Thus, quality (such as fidelity and uniformity of shape and dimensions) of a pattern and the like for an electronic device formed on the substrate P can be kept within a predetermined permissible range over the total length Lf of the substrate P.

Furthermore, as in variation 1 and variation 2, after pre-setting the conveying speeds Va, Vb, and Vc of the substrate P in each of the processing devices PR2 to PR4, and after starting continuous processing over the total length Lf of the substrate P, for example, when the quality of the pattern appearing after the processing device PR4 (PR5) fluctuates for the target value due to the thickness of the resist layer coated by the processing device PR2 fluctuating, each processing condition (setting conditions) in each of the processing device PR3 and the processing device PR4 (PR5) is adjusted. At that time, as in the first embodiment described above, it is possible to transition to a control method incorporating a mode for finely adjusting the conveying speeds Vb and Vc of the substrate P preset in the processing device PR3 and the processing device PR4. Note that variation 1 and variation 2 have been described on the assumption of the three processing devices PR2, PR3, and PR4 (PR5) and the two storage devices BF1 and BF2, but can similarly be applied even to a manufacturing system configured by one of the storage devices provided between two of the processing devices PR. Furthermore, in variation 1 and variation 2, the conveying speeds Va, Vb, and Vc of the substrate P in each of the processing devices PR2 to PR4, if possible, are preferably set equal to each other within a predetermined permissible range (for example, within ±several %).

In the above variation 1 and variation 2, when forming a pattern for an electronic device on the substrate P while conveying the long flexible sheet-shaped substrate P along the length direction, a device manufacture method is performed that can reduce the possibility of stopping the entire manufacture line by: performing a conveying process for conveying a substrate P in the order of a first processing process for performing a different processing to the substrate P (for example, a film forming process in the processing device PR2) and a second processing process (for example, an exposure process in the processing device PR3, and a developing process, plating process, and the like in the processing devices PR4 and PR5); selectively or uniformly depositing a coating layer (photosensitive functional layer) on the surface of the substrate P under the first processing conditions set in the processing device PR of the first processing process; generating a reformed portion corresponding to the pattern on the coating layer, and causing a pattern to appear on the substrate P by performing a processing for removing either one of the reformed portion and the non-reformed portion, or a processing for precipitating a material for an electronic device on either one of the reformed portion and the non-reformed portion, under the second processing conditions set on the processing device PR of the second processing process; and determining whether at least one of the condition of the first processing conditions and the second processing conditions have been changed depending on the trend, when the pattern appearing in the second processing process displays a tendency to fluctuate with respect to the target shape or dimension (a tendency for the quality to decrease). That is, when determined that at least one of the conditions of the first processing conditions and the second processing conditions have changed, it means that it can notify in advance if the operation of the manufacture line for maintaining the quality of the pattern formed on the substrate P can be continued. Thus, it is possible for the operator at the production site to avoid stopping the manufacture line at an early stage. This also applies to the first embodiment described above.

Second Embodiment

Figure 10:
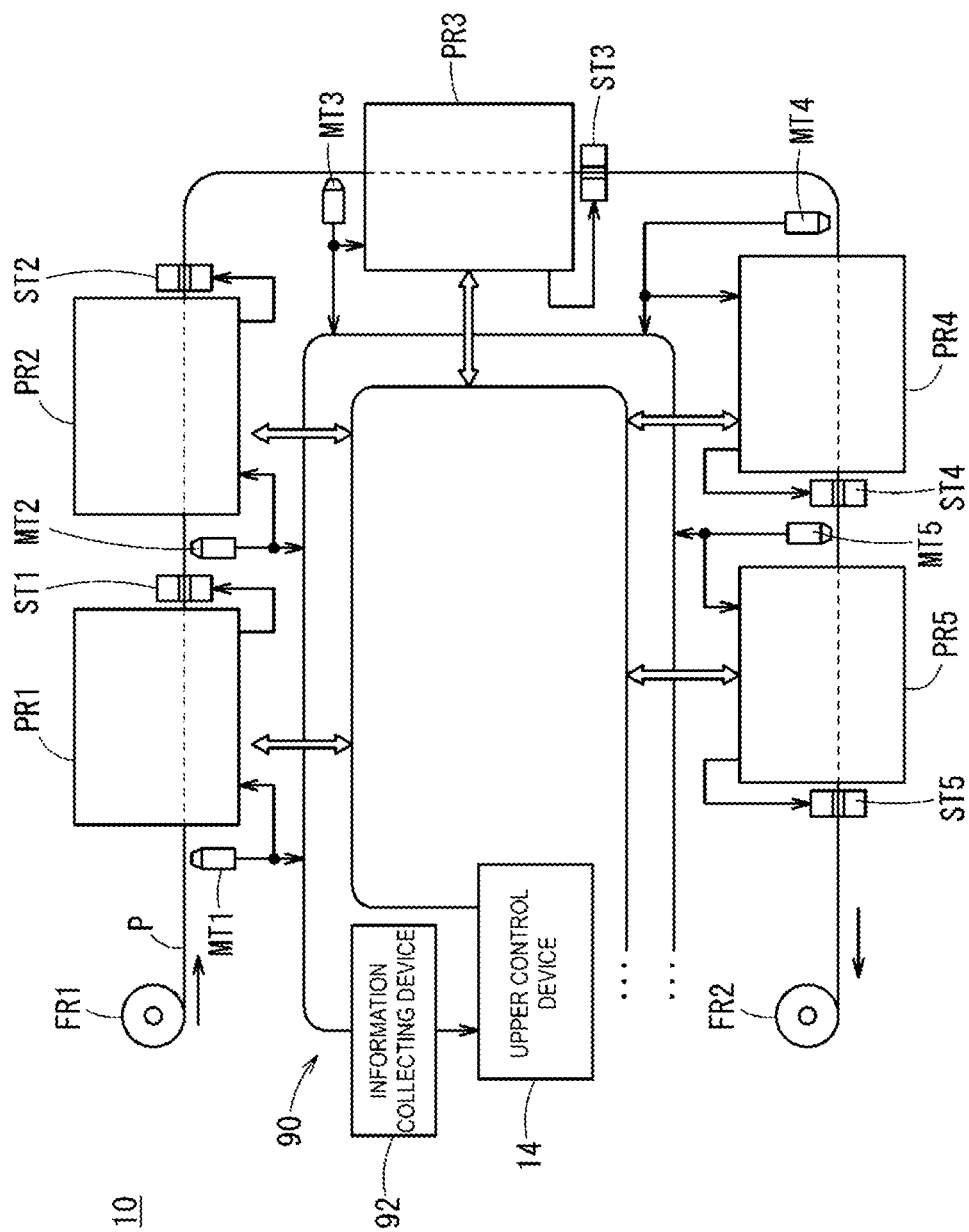
FIG. 10 is a schematic configuration view illustrating a schematic configuration of a device manufacturing system according to a second embodiment.

A second embodiment will now be described. The same configuration as the aforementioned first embodiment will be denoted by the same reference numerals, and a description thereof will be omitted. FIG. 10 is a schematic configuration illustrating a schematic configuration of the device manufacturing system 10 according to the present second embodiment. Note that in FIG. 10, the illustration of the first storage device BF1 and the second storage device BF2 is omitted.

The device manufacturing system 10 has an information forming device ST for forming (applying) information in the substrate P, and an information collecting device 90 for collecting information by reading the information formed (applied) by the substrate P. The information forming devices ST (ST1 to ST5) may form information by printing on the substrate P using an inkjet method, or may form information by marking on the substrate P. Furthermore, the information forming devices ST (ST1 to ST5) may form the content of the information desired to be formed on the substrate P as is, and may form content of the formed information on the substrate by encryption (for example, bar code, QR code).

The information forming device ST1 forms information relating to the processing state, which the processing device PR1 performed on the substrate P, on the substrate P. The processing state, which the processing device PR1 performed on the substrate P, is the actual processing state such as the voltage applied for emitting plasma and the irradiation time that the plasma is irradiated. The information forming device ST1 forms information on the substrate P relating to the processing state of the processing device PR1 in the substrate P, according to the control of the lower control device, not illustrated, or the upper control device 14 of the processing device PR1. The information forming device ST1 may be provided between the processing device PR1 and the processing device PR2 along the conveying direction of the substrate P, and may be provided on the inner portion of the processing device PR1. The information forming device ST1 may form information on the substrate P relating to the processing state, which the processing state PR1 applied to the electronic device region W, for each electronic device region W, and may form information on the substrate P relating to the processing state applied to the electronic device region W when there is a tendency for the processing state applied to the electronic device region W to change beyond a certain range.

The information forming device ST2 forms information relating to the processing state, which the processing device PR2 performed on the substrate P, and the processing error E2 on the substrate P. The processing state, which the processing device PR2 performs on the substrate P, is the actual processing state such as the film thickness of the photosensitive functional layer actually deposited. The processing error E2 is the process error or the like for the target film thickness condition of the film thickness on the photosensitive functional layer actually deposited. The information forming device ST2 forms information on the substrate P relating to the processing state of the processing device PR2 and the processing error E2, according to the control of the lower control device 18 or the upper control device 14 of the processing device PR2. The information forming device ST2 may be provided between the processing device PR2 and the first storage device BF1, or the processing device PR3, along the conveying direction of the substrate P, and may be provided on the inner portion of the processing device PR2, which is on the downstream side of a drying device 16. The information forming device ST2 may form information on the substrate P relating to the processing state and the processing error E2, which the processing state that the processing device PR2 applied to the electronic device region W, for each electronic device region W, and may form information on the substrate P relating to the processing state and the processing error E2 applied to the electronic device region W when there is a tendency for the processing state and the processing error E2 applied to the electronic device region W to change beyond a certain range.

The information forming device ST3 forms information relating to the processing state, which the processing device PR3 performed on the substrate P, and the processing error E3 on the substrate P. The processing state, which the processing device PR3 performed on the substrate P, is the actual processing such as the strength of the laser light LB and the scanning speed of the spot light SP. The processing error E3 is the processing error for the target strength condition of the strength of the laser light LB actually irradiated, the processing error for the target scanning speed condition of the scanning speed of the spot light SP, and the like. The information forming device ST3 forms information on the substrate P relating to the processing state of the processing device PR3 and the processing error E3, according to the control of the lower control device 24 or the upper control device 14 of the pattern forming device 12. The information forming device ST3 may be provided between the processing device PR3 and the second storage device BF2, or the processing device PR4, along the conveying direction of the substrate P, and may be provided on the inner portion of the processing device PR3, which is on the downstream side of a rotation drum DR2. The information forming device ST3, for each electronic device region W, may form information on the substrate P relating to the processing state and the processing error E3, where the processing state is applied to the electronic device region W by the processing device PR3, and may form information on the substrate P relating to the processing state and the processing error E3, where the processing state is applied to the electronic device region W when there is a tendency for the processing state and the processing error E3 applied to the electronic device region W to change beyond a certain range.

The information forming device ST4 forms information relating to the processing state, which the processing device PR4 performed on the substrate P, and the processing error E4 on the substrate P. The processing state, which the processing device PR4 performed on the substrate P, is the actual processing state such as the temperature, concentration, immersion time, and the like of the development fluid. The processing error E4 is the processing error for the target temperature condition of the actual development fluid, the processing error for the target concentration condition of the concentration of the actual development fluid, the processing error for the target immersion time condition of the actual immersion time, and the like. The information forming device ST4 forms information on the substrate P relating to the processing state of the processing device PR4 and the processing error E4, according to the control of the lower control device 80 or the upper control device 14 of the processing device PR4. The information forming device ST4 may be provided between the processing device PR4 and the processing device PR5, along the conveying direction of the substrate P, and may be provided on the inner portion of the processing device PR4, which is on the downstream side of a guide roller R7. The information forming device ST4 may form information on the substrate P relating to the processing state and the processing error E4, which the processing state that the processing device PR4 applied to the electronic device region W, for each electronic device region W, and may form information on the substrate P relating to the processing state and the processing error E4 applied to the electronic device region W when there is a tendency for the processing state and the processing error E4 applied to the electronic device region W to change beyond a certain range.

The information forming device ST5 forms information relating to the processing state, which the processing device PR5 performed on the substrate P, and the processing error E5 on the substrate P. The processing state, which the processing device PR5 performed on the substrate P, is the actual processing state such as the temperature, concentration, immersion time, and the like of the etching fluid. The processing error E5 is the processing error for the target temperature condition of the actual etching fluid, the processing error for the target concentration condition of the concentration of the actual etching fluid, the processing error for the target immersion time condition of the actual immersion time, and the like. The information forming device ST5 forms information on the substrate P relating to the processing state of the processing device PR5 and the processing error E5, according to the control of the lower control device 80 or the upper control device 14 of the processing device PR5. The information forming device ST5 may be provided on the downstream side of the processing device PR5, along the conveying direction of the substrate P, and may be provided on the inner portion of the processing device PR5, which is on the downstream side of a guide roller R7. The information forming device ST5, for each electronic device region W, may form information on the substrate P relating to the processing state and the processing error E5, where the processing state is applied to the electronic device region W by the processing device PR5, and may form information on the substrate P relating to the processing state and the processing error E5, where the processing state is applied to the electronic device region W when there is a tendency for the processing state and the processing error E5 applied to the electronic device region W to change beyond a certain range.

Figure 11:
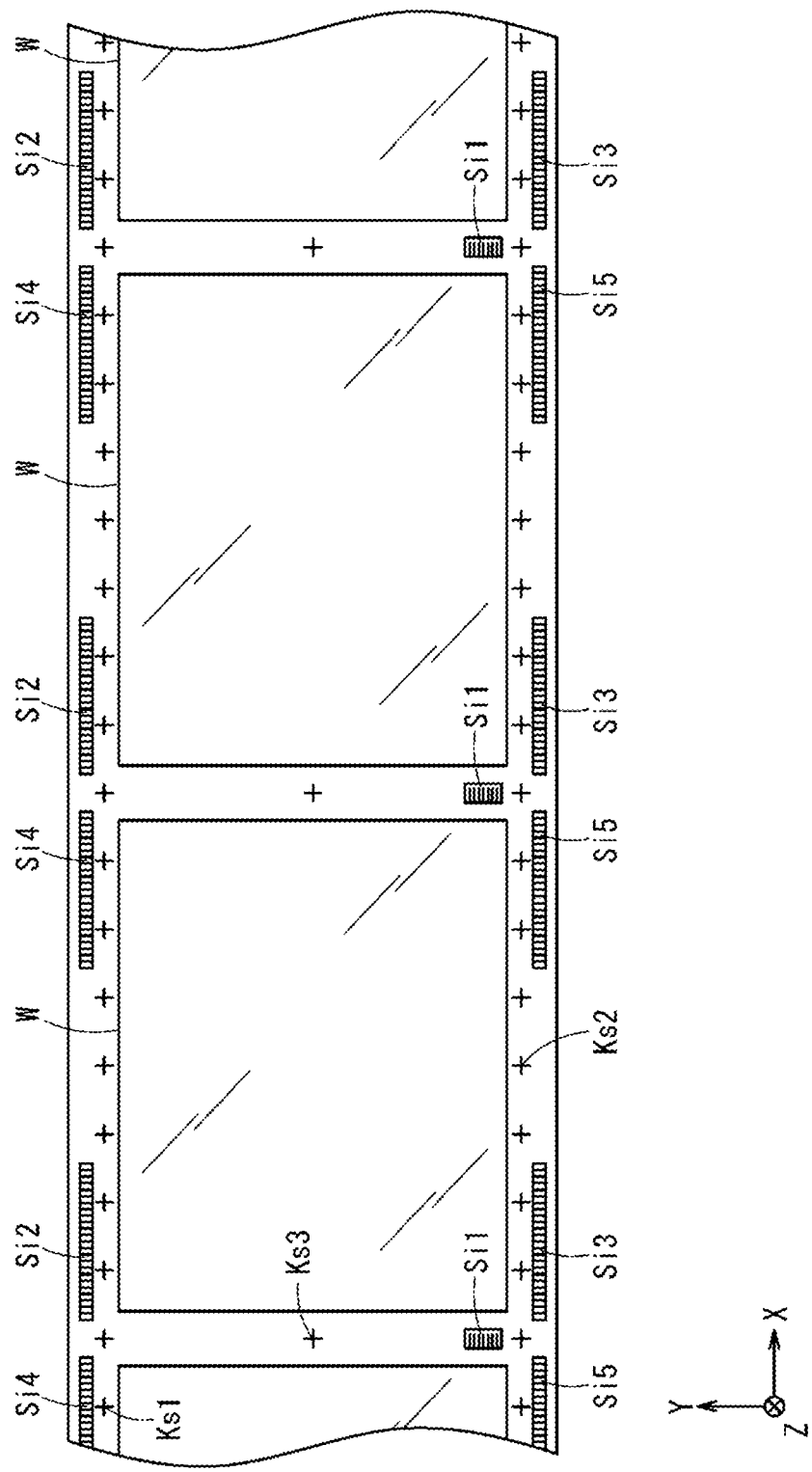
FIG. 11 is a view illustrating an example of information formed on a substrate by the information formation device in FIG. 10.

The information forming devices ST1 to ST5, as illustrated in FIG. 11, forms information in a region other than the electronic devices region W of the substrate P. Si1 of FIG. 11 indicates the information formed by the information forming device ST1, and Si2 indicates information formed by the information forming devices ST2. Similarly, Si3, Si4, and Si5 indicates information formed by the information forming devices ST3, ST4, and ST5. The information forming devices ST1 to ST5 form information Si1 to Si5 in a region on substrates P differing from each other. Thus, it can be easily recognized which information forming device ST1 to ST5 formed the information based on the region in which the information S1 was formed on the substrate P.

Note that the information Si1 to Si5 formed on the substrate P may be formed inside the electronic device region W. In that case, the formation surface area of the information Si1 to Si5 is made to be sufficiently small, disposed in a blank region inside the electronic device region W so as to not affect wiring and semiconductor element for the devices, or the pixel region and the like, in the electronic devices region W. Alternatively, when a relatively large electrode pad is formed for connecting to an external circuit in the electronic device region W, the information Si1 to Si5 may be formed inside that pad.

The information collecting device 90 is provided with information reading portions MT (MT1 to MT5) for reading the information S1 formed (applied) on the substrate P, and an information collecting portion 92 for collecting the information S1 read by the information reading portions (MT1 to MT5). The information reading portions MT (MT1 to MT5) read the information S1 formed on the substrate P by imaging the substrate P. The information reading portion MT1 reads information S1 relating to the processing state or the processing error performed on the substrate P in a process prior to the processing device PR1, according to the control of the lower control device, not illustrated, or the upper control device 14 of the processing device PR1. The information reading portion MT1 may be provided on the upstream side of the processing device PR1 along the conveying direction of the substrate P, and may also be provided on the inner portion of the processing device PR1.

The information reading portion MT2 reads information Si1 relating to the processing state that the information forming device ST1 formed on the substrate P, according to the control of the lower control device 18 or the upper control device 14 of the processing device PR2. The information reading portion MT2 may be provided on the downstream side of the information forming device ST1, between the processing device PR1 and the processing device PR2 along the conveying direction of the substrate P. Note that since the information reading portion MT2 may be provided downstream from the information forming device ST1, for example, it may also be provided in the interior of the processing devices PR2. The information reading portion MT3 reads information Si2 relating to the processing state or the processing error E2 that the information forming device ST2 formed on the substrate P, according to the control of the lower control device 24 or the upper control device 14 of the pattern forming device 12. The information reading portion MT3 is provided downstream from the information forming device ST2, between the processing devices PR2 or the first storage device BF1 and the processing device PR3 along the conveying direction of the substrate P. Note that since the information reading portion MT3 may be provided downstream from the information forming device ST2, for example, it may also be provided in the interior of the processing devices PR3.

The information reading portion MT4 reads information Si3 relating to the processing state or the processing error E3 that the information forming device ST3 formed on the substrate P, according to the control of the lower control device 80 or the upper control device 14 of the processing device PR4. The information reading portion MT4 is provided downstream from the information forming device ST3, between the processing devices PR3 or the second storage device BF2 and the processing device PR4 along the conveying direction of the substrate P. Note that since the information reading portion MT4 may be provided downstream from the information forming device ST3, for example, it may also be provided in the interior of the processing devices PR4. The information reading portion MT5 reads information Si4 relating to the processing state or the processing error E4 that the information forming device ST4 formed on the substrate P, according to the control of the lower control device 80 or the upper control device 14 of the processing device PR5. The information reading portion MT5 may be provided downstream side from information forming device ST4, between the processing device PR4 and the processing device PR5 along the conveying direction of the substrate P. Note that since the information reading portion MT5 may be provided downstream from the information forming device ST4, for example, it may also be provided in the interior of the processing devices PR5. The information Si5 that the information forming device ST5 formed on the substrate P is read when performing a processing of the following process.

The information collecting portion 92 collects the information S1 read by the information reading portions MT1 to MT5, and outputs it to the upper control device 14. The upper control device 14 can determine whether the actual processing state of each of the processing devices PR1 to PR5 generates a processing error E that exceeds the permissible range for the target processing state based on information S1 read from the information reading portions MT1 to MT5, and when the processing error E is generated that exceeds the permissible range, the setting conditions of the processing devices PR is changed as described in the first embodiment. In the present second embodiment, the information Si1 to Si5 relating to the processing state or the processing error E, which each processing device PR1 to PR5 in each of the electronic device regions W performed in the electronic device region W, is formed on the substrate P, or when there is a tendency for the processing state or the processing error E performed in the electronic device region W change beyond a certain range, the information Si1 to Si5 relating to the processing state or the processing error E that each processing device PR1 to PR5 performed in the electronic device region W is formed on the substrate P. Therefore, the upper control device 14 can easily manage the processing state or the processing error E applied by each processing device PR1 to PR5 in each electronic device region W. Therefore, the pattern formed on each electronic device region W can be the desired pattern.

Furthermore, since the substrate P is a sheet-like substrate, when the pattern for the electronic device formed on the device forming region W of the substrate P is defective, the substrate P is cut and a portion of the substrate (defective portion, for example, defective device forming region W portion) is removed, and there are cases where the remaining substrate P is joined and becomes one substrate P. Furthermore, there are also cases where another substrate P is connected to the portion cut and removed and joined to the substrate P. Thus, by cutting and joining the substrate P, the order of the electronic device W changes significantly, making it difficult to understand the actual processing state performed in each electronic device region W. For example, the electronic device regions W in the order of 1, 2, 3, 4, 5, 6, 7, . . . cuts and removes the fourth and fifth electronic device regions W of the substrate P connected along the length direction of the substrate P, and instead, the electronic device regions W in the order of a, b, c, d, . . . are connected to the substrate P connected along the length direction of the substrate P, and the electronic device regions W are connected in the order of 1, 2, 3, a, b, c, d, 6, 7, . . . , becoming a single substrate P. In this case, it is difficult to understand the actual processing state applied to each electronic device region W of the substrate P, but in the second embodiment, since the state relating to the processing state of the processing error E of each processing device PR1 to PR5 is formed on the substrate P, even in such a case, it is possible to easily understand the actual process state applied to each electronic device region W.

As described above, according to the second embodiment of the present invention, among the plurality of processing devices PR1 to PR5, since there is a processing device PR in which the actual processing state generates the processing error E of the target processing state, the processing device PR that particularly performs the post-process can continuously perform the post-process by determining whether the processing error E generated in a prior process can be recovered by reading information on the substrate, and deriving the processing condition when recovery is possible. Thus, it is possible to continuously manufacture an electronic device without stopping the manufacture line.

Furthermore, the second embodiment of the present invention is not limited to a manufacturing line in which three different processing devices PR (processing portions) are always aligned in the conveying direction (length direction) of the substrate P, but can be performed as long as at least two processing devices PR (processing portions) for sequentially processing the substrate P are aligned. In this case, the two processing devices PR (processing portions) applied by the second embodiment do not necessarily need to be disposed one behind the other in the conveying direction (length direction) of the substrate P, but may be configured having at least one other processing devices PR (processing portion) disposed between two applied processing devices PR (processing portions). For example, when performing the development processing after the exposure processing, the substrate P is not immediately sent to the development portion via the exposure portion, but when developing after performing a post-bake processing in which a photoresist layer is heated at a relatively high temperature after exposure, a heating device (heating portion) and the like for the post-bake processing may correspond to the other processing device PR.

Variations of the First and Second Embodiment

The first and second embodiment may have the following variations.

Variation 1

In variation 1, the processing device PR3 and the processing device PR4 is configured as one processing unit PU2. In other words, the processing unit PU2 is a device for performing a processing process of exposure processing and development processing (second processing process) while conveying the substrate P conveyed from the processing device PR2 in the conveying direction (+X direction). The latent image (reformed portion) corresponding to the pattern is formed by this exposure processing on the photosensitive functional layer, and either one of the reformed portion or the non-reformed portion is dissolved and removed by the development processing, whereby a pattern appears on the photosensitive functional layer. Note that the processing unit PU2 may be a device for performing a processing process of an exposure processing and a plating processing, and in this case, the material (metal) for the electronic device such as a palladium ion is precipitated on either one of the reformed portion or the non-reformed portion by the plating processing.

Figure 12:
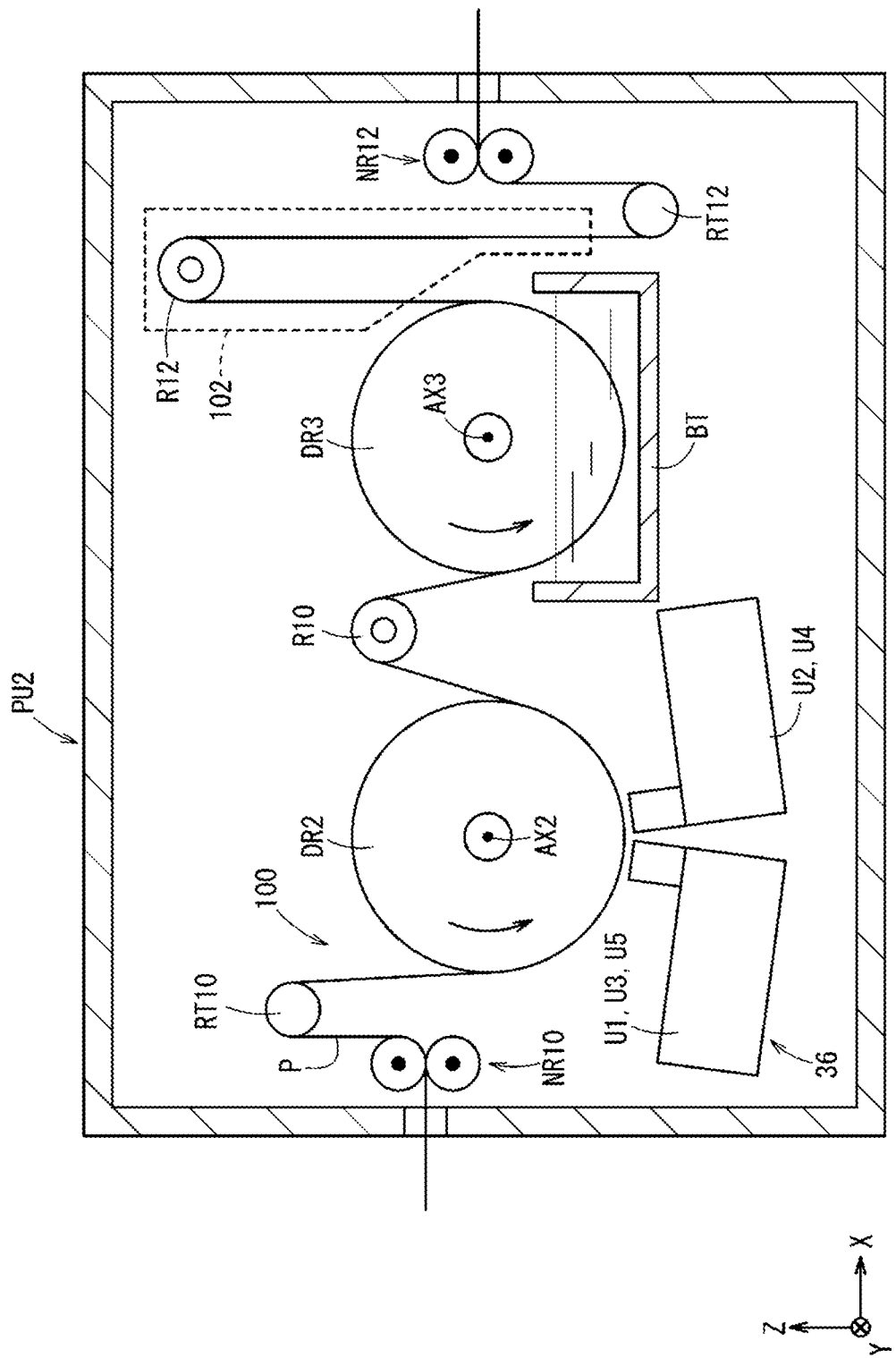
FIG. 12 is a view illustrating a configuration of a processing unit of variation 1.

FIG. 12 is a view illustrating the configuration of the processing unit PU2. The configurations the same as the first and second embodiment will be denoted by the same reference numeral and a description thereof will be omitted, and the illustrations for the configuration that are not particularly necessary for describing variation 1 will be omitted. The processing unit PU2 is provided with a conveying portion 100, exposure head 36, processing tank BT, and drying portion 102. Note that, although not illustrated in the drawings, the processing unit PU2 also has a light source device 32, a light induction optical system 34, a strength sensor 37, alignment microscopes AM (AM1 to AM3), heaters H1 and H2, a heater driving portion 82, a temperature sensor Ts, a concentration sensor Cs, an imaging device 83, and the like. Furthermore, the processing unit PU2 is controlled using the lower control device, not illustrated. The first storage device BF1 is provided between the processing device PR2 and the processing unit PU2, and the second storage device BF2 is provided between the processing unit PU2 and the processing device PR5.

The conveying portion 100 has a drive roller NR10, a tension adjusting roller RT10, a rotation drum DR2, a guide roller R10, a rotation drum DR3, a guide roller R12, a tension adjusting roller RT12, and a drive roller NR12 in order from the upstream side (−X direction side) of the conveying direction of the substrate P. The drive roller NR10 conveys the substrate P toward the rotation drum DR2 by rotating while sandwiching the front and back surfaces of the substrate P sent from the processing device PR2 via the first storage device BF1. The rotation drum DR2 conveys the substrate P to the guide roller R10 by rotating around central axis AX2 while supporting one portion of the substrate P in the length direction following the outer peripheral surface. The guide roller R10 guides the substrate P sent from the rotation drum DR2 to the rotation drum DR3.

The rotation drum DR3 has a central axis AX3 extending in the Y direction, and a cylindrical circumferential surface with a constant radius from the central axis AX3, and guides the substrate P to the guide roller R12 by rotating around the central axis AX3 while supporting one portion of the substrate P in the length direction following the outer peripheral surface (circumferential surface). The rotation drum DR3 supports the substrate P by approximately half the circumferential surface of the outer peripheral surface on the lower side (−Z direction side, that is, the direction in which gravity acts). The guide roller R12 conveys the sent substrate P toward the drive roller NR12. The drive roller NR12 conveys the substrate P to the processing device PR5 side by rotating while sandwiching the front and back surface of the sent substrate P. The tension adjusting rollers RT10 and RT12 apply a predetermined tension to the substrate P conveyed between the drive roller NR10 and the drive roller NR12. The tension adjusting roller RT10 is biased in the +Z direction, and the tension adjusting roller RT12 is biased in the −Z direction.

The drive rollers NR10 and NR12, and the rotation drums DR2 and DR3 rotate due to a rotation torque applied from the rotating drive source (motor or reducer and the like) controlled by the lower control device of the processing unit PU2. The conveying speed of the substrate P in the processing unit PU2 is defined by the rotating speed of the drive roller NR10 and NR12, and the rotation drum DR2 and DR3. Furthermore, the rotation speed signal (conveying speed information of the substrate P) sent from an encoder, not illustrated, provided in the drive roller NR10 and NR12, and the rotation drum DR2 and DR3, is sent to the upper control device 14 via the lower control device of the processing unit PU2.

The rotation drum DR3 is provided above the processing tank BT so that one portion of the circumferential surface is immersed in the development fluid kept in the processing tank BT. Therefore, the substrate P supported by the rotation drum DR3 can be immersed in the development fluid. Furthermore, the rotation drum DR3 (or processing tank BT) can move in the Z direction, the surface on which the circumferential surface of the rotation drum DR3 is immersed in the development fluid kept in the processing tank BT is reduced when the rotation drum DR3 moves in the +Z direction (or the processing tank BT moves in the −Z direction), and the surface on which the circumferential surface of the rotation drum DR3 is immersed in the development fluid kept in the processing tank BT is increased when the rotation drum DR3 moves in the −Z direction (or the processing tank BT moves in the +Z direction). Thus, by moving the rotation drum DR3 (or the processing tank BT) in the Z direction, the time that the substrate P is immersed in the development fluid (immersion time) can be changed. Although not illustrated, a driving mechanism for adjusting the interval (interval between the central axis AX3 of the rotation drum DR3 and the surface of the development fluid in the processing tank BT) of the Z direction for the rotation drum DR3 and the processing tank BT is provided in the rotation drum DR3 (or processing tank BT), and the driving mechanism is driven by controlling the lower control device of the processing unit PU2. The guide roller R12 is provided in the drying portion 102, and the drying portion 102 removes the development fluid adhering to the substrate P that is conveyed from the rotation drum DR3 to the tension adjusting roller RT12 via the guide roller R12.

Note that when the photosensitive functional layer is a photosensitive silane coupling agent or a photosensitive reducing agent, a plating fluid including a material (metal) for an electronic device such as palladium ion is kept in the processing tank BT of the processing unit PU2 instead of the development fluid. In other words, in this case, the processing unit PU2 is a device for performing the exposure processing and the plating processing. By immersing the substrate P in the plating fluid, the material for the electronic device is precipitated corresponding to the latent image (reformed portion) formed on the photosensitive functional layer, and a pattern is formed on the substrate P. In the case of a positive type, the portion whereon ultraviolet rays are irradiated is modified, and the material for the electronic device is precipitated on the non-reformed portion whereon ultraviolet rays are not irradiated. In the case of a negative type, the portion whereon ultraviolet rays are irradiated is modified, and the material for the electronic device is precipitated on the reformed portion. Thus, a pattern for the metal layer (conductive) appears on the substrate P. Here, the interval of the Z direction for the rotation drum DR3 and the processing tank BT is adjusted, the immersion time to the plating fluid of the substrate P can be adjusted by adjusting the amount of plating fluid (fluid surface height) in the processing tank BT, and the concentration of the palladium to be precipitated on the surface of the substrate P can be adjusted.

The processing unit PU2 performs the exposure processing and the development processing (or plating processing) according to the setting conditions (second setting conditions). Processing conditions (second processing conditions) including: a strength condition for defining the strength of the laser light LB, a scanning speed condition for defining the scanning speed (rotation speed of the polygon mirror 66) of the spot light SP, an exposure frequency condition for defining the frequency of multiple exposures, a pattern condition (pattern data) for defining a pattern to be drawn, a temperature condition for defining a temperature for the development fluid (or plating fluid), a concentration condition for defining a concentration of the development fluid (or plating fluid), an immersion time condition for defining the immersion time, and the like, and a conveying speed condition of the substrate P are set as the setting conditions of the processing unit PU2. The exposure processing is performed according to the strength condition, scanning speed condition, exposure frequency condition, pattern condition, and the like. The development processing (or plating processing) is performed according to the temperature condition, concentration condition, immersion time condition, and the like. The actual processing state applied by the processing unit PU2 of these setting conditions is preset to be the target processing state.

Since the first embodiment described the change of the setting conditions it will not be described in detail, but when at least one of the states of actual processing applied on the substrate P in each of the processing devices PR1, PR2, PR5 and the processing unit PU2 exhibits a processing error E that exceeds the permissible range for the target processing state, the upper control device 14 changes the setting conditions of the other processing device PR or the processing unit PU2 generating the processing error E, according to the processing error E. The reason, obviously, is because when any one of the actual processing states that the processing devices PR1, PR2, PR5 and the processing unit PU2 applied to the substrate P according to the setting conditions has a processing error E that exceeds the permissible range for the target processing state, the desired pattern of the metal layer cannot appear on the substrate P.

When the setting conditions exhibiting the processing error E is the setting conditions of the processing unit PU2, first the setting conditions of the processing unit PU2 is changed so that the processing error E does not occur, or so that the processing error E falls within the permissible range. Then, when it cannot be supported by only changing the setting conditions of the processing unit PU2, the setting conditions of the other processing devices PR (PR2 and PR5) are further changed so that the processing error does not occur, or so that the processing error falls within the permissible range. At this time, after the change of the setting conditions of the other processing devices PR is completed, the conveying speed condition of at least the processing unit PU2 may be restored. Furthermore, when the setting conditions exhibiting the processing error E is the setting conditions of another processing device PR other than the processing unit PU2, the setting conditions of the processing unit PU2 is preferentially changed so that the processing error E does not occur, or so that the processing error E falls within the permissible range. The information relating to the actual processing state or the processing error E applied to the substrate P by the processing unit PU2 is formed on the substrate P by the information forming device ST, not illustrated. Furthermore, the information is read by the information reading portion MT5. Note that although the first storage device BF1 and the second storage device BF2 is provided before and after the processing unit PU2, it may also be provided before and after another processing device PR.

Note that, as illustrated in FIG. 12, when the exposure processing portion (rotation drum DR2, exposure head 36, and the like) and the wet-type processing portion (rotation drum DR3, processing tank BT, and the like) is the integrally provided processing unit PU2, the conveying speed of the sheet substrate P in the processing unit PU2 is constant, and the conveying speed of the sheet substrate P cannot be temporarily different in the exposure processing portion and the wet-type processing option. Thus, when wanting the conveying speed of the sheet substrate P to be different, the storage device BF1 and BF2 is provided as illustrated in FIG. 3 in the position of the guide roller R10. In other words, the first storage device BF1 and the second storage device BF2 is provided before and after the processing unit PU2, and one storage device having a configuration similar to the first storage device BF1 (second storage device BF2) is provided between the rotation drum DR2 and the rotation drum DR3. Furthermore, the first storage device BF1 may be provided between the processing device PR2 and the rotation drum DR2, and the second storage device BF2 may be provided between the rotation drum DR2 and the rotation drum DR3. Furthermore, the first storage device BF1 may be provided between the rotation drum DR2 and the rotation drum DR3, and the second storage device BF2 may be provided between the rotation drum DR3 and the processing device PR5.

Variation 2

In variation 2, the processing device PR2 and the processing device PR3 is configured as one processing unit PU1. In other words, the processing unit PU1 is a device for performing a processing process of film formation processing and an exposure processing (first processing process) while conveying the substrate P conveyed from the processing device PR1 in the conveying direction (+X direction). A photosensitive functional fluid is selectively or uniformly coated on the surface of the substrate P by this film formation processing, thereby selectively or uniformly forming the photosensitive functional layer on the surface of the substrate P, and the latent image (reformed portion) corresponding to the pattern is formed on the photosensitive functional layer.

Figure 13:
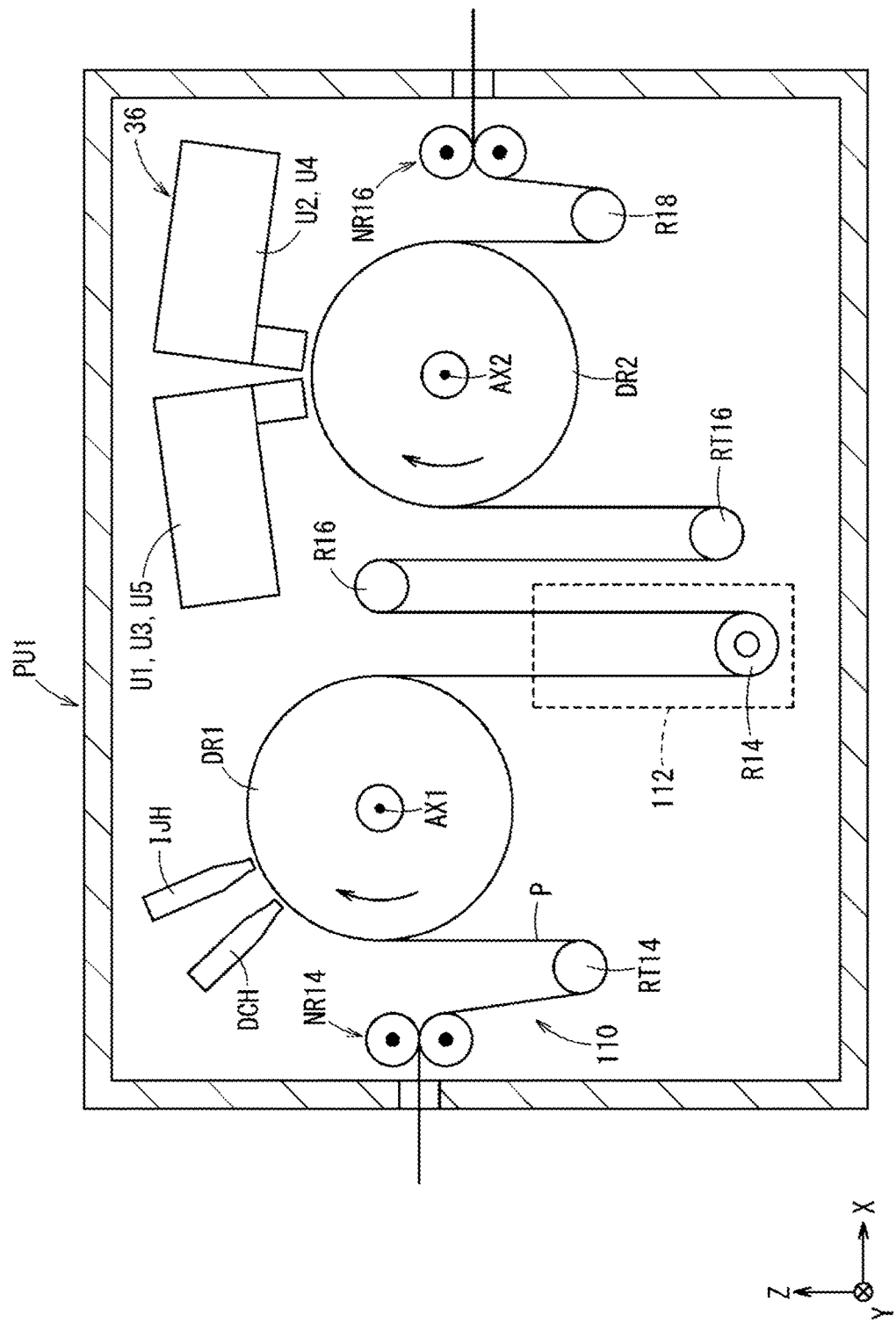
FIG. 13 is a view illustrating a configuration of a processing unit of variation 2.

FIG. 13 is a view illustrating the configuration of the processing unit PU1. The configurations the same as the first and second embodiment will be denoted by the same reference numeral and a description thereof will be omitted, and the illustrations for the configuration that are not particularly necessary for describing variation 2 will be omitted. The processing unit PU1 is provided with a conveying portion 110, die coater head DCH, ink jet head IJH, drying portion 112, and exposure head 36. Note that, although not illustrated, the processing unit PU1 also has a light source device 32, a light induction optical system 34, a strength sensor 37, alignment microscopes AM (AM1 to AM3), film thickness measuring device 16a, and the like. Furthermore, the processing unit PU1 is controlled using the lower control device, not illustrated. The first storage device BF1 is provided between the processing device PR1 and the processing unit PU1, and the second storage device BF2 is provided between the processing unit PU1 and the processing device PR4.

The conveying portion 110 has a drive roller NR14, a tension adjusting roller RT14, a rotation drum DR1, guide rollers R14 and R16, a tension adjusting roller RT16, a rotation drum DR2, a guide roller R18, and a drive roller NR16 in order from the upstream side (−X direction side) of the conveying direction of the substrate P. The drive roller NR14 conveys the substrate P toward the rotation drum DR1 by rotating while sandwiching the front and back surfaces of the substrate P sent from the processing device PR1 via the first storage device BF1. The rotation drum DR1 conveys the substrate P in the +X direction by rotating around central axis AX1 while supporting one portion of the substrate P in the length direction following the outer peripheral surface (circumferential surface). The guide rollers R14 and R16 guide the substrate P sent from the rotation drum DR1 to the rotation drum DR2.

The rotation drum DR2 conveys the substrate P to the guide roller R18 by rotating around central axis AX2 while supporting one portion of the substrate P in the length direction following the outer peripheral surface. The guide roller R18 guides the substrate P sent from the rotation drum DR2 to the drive roller NR16. The drive roller NR16 conveys the substrate P to the processing device PR4 side by rotating while sandwiching the front and back surfaces of the sent substrate P. The tension adjusting rollers RT14 and RT16 apply a predetermined tension to the substrate P conveyed between the drive roller NR14 and the drive roller NR16. The tension adjusting rollers RT14 and RT16 are biased in the −Z direction.

The drive rollers NR14 and NR16, and the rotation drums DR1 and DR2 rotate due to a rotation torque applied from the rotating drive source (motor or reducer and the like) controlled by the lower control device of the processing unit PU1. The conveying speed of the substrate P in the processing unit PU1 is defined by the rotating speed of the drive rollers NR14 and NR16, and the rotation drums DR1 and DR2. Furthermore, the rotation speed signal (conveying speed information of the substrate P) sent from an encoder, not illustrated, provided in the drive rollers NR14 and NR16, and the rotation drum DR1 and DR2, is sent to the upper control device 14 via the lower control device of the processing unit PU1.

The guide roller R14 is provided in the drying device 112, the driving device 112 dries the photosensitive functional fluid by removing the solute (solvent or water) included in the photosensitive functional fluid by blowing air for drying such as hot air or dry air for the substrate P conveyed from that rotation drum DR1 to the guide roller R16 via the guide roller R14. The photosensitive functional layer is formed in this way.

The processing unit PU1 performs the film formation processing according to the setting conditions (first setting conditions). Processing conditions (first processing conditions) including: a region condition for defining the region in which the photosensitive functional layer is formed, a film thickness condition for defining the film thickness of the photosensitive functional layer, a strength condition for defining the strength of the laser light LB, a scanning speed condition for defining the scanning speed (rotation speed of the polygon mirror 66) of the spot light SP, an exposure frequency condition for defining the frequency of multiple exposures, a pattern condition (pattern data) for defining a pattern to be drawn, and the like, and a conveying speed condition of the substrate P are set as the setting conditions of the processing unit PU1. The film formation processing is performed according to the region condition, film thickness condition, and the like. The exposure processing is performed according to the strength condition, scanning speed condition, exposure frequency condition, pattern condition, and the like. The actual processing state applied by the processing unit PU1 of these setting conditions is preset to be the target state.

Since the first embodiment described the change of the setting conditions, it will not be described in detail, but when at least one of the states of actual processing applied on the substrate P in each of the processing devices PR1, PR4, PR5 and the processing unit PU1 exhibits a processing error E that exceeds the permissible range for the target processing state, the upper control device 14 changes the setting conditions of the other processing device PR or the processing unit PU1 generating the processing error E, according to the processing error E. The reason, obviously, is because when any one of the actual processing states that the processing devices PR1, PR4, PR5 and the processing unit PU1 apply to the substrate P according to the setting conditions has a processing error E that exceeds the permissible range for the target processing state, the desired pattern of the metal layer cannot appear on the substrate P.

When the setting conditions exhibiting the processing error E is the setting conditions of the processing unit PU1, first the setting conditions of the processing unit PU1 is changed so that the processing error E does not occur, or so that the processing error E falls within the permissible range. Then, when it cannot be supported by only changing the setting conditions of the processing unit PU1, the setting conditions of the other processing devices PR (PR4 and PR5) are further changed so that the processing error E does not occur, or so that the processing error E falls within the permissible range. At this time, after the change of the setting conditions of the other processing devices PR is completed, the conveying speed condition of at least the processing unit PU1 may be restored. Furthermore, when the setting conditions exhibiting the processing error E is the setting conditions of another processing device PR other than the processing unit PU1, the setting conditions of the processing unit PU1 is preferentially changed so that the processing error E does not occur, or so that the processing error E falls within the permissible range. The information relating to the actual processing state or the processing error E applied to the substrate P by the processing unit PU1 is formed on the substrate P by the information forming device ST, not illustrated. Furthermore, this information is read by the information reading portion MT4. Note that although the first storage device BF1 and the second storage device BF2 is provided before and after the processing unit PU1, it may also be provided before and after another processing device PR.

In the variation 2 described above, as in FIG. 13, since the coating processing portion (rotation drum DR1, die coater head DCH, ink jet head IJH, and the like), drying processing portion (drying device 112 and the like), exposure processing portion (rotation drum DR2, exposure head 36, and the like), is the integrally provided processing unit PU1, the conveying speed of the substrate P in the processing unit PU1 is the same everywhere. However, in each of the coating processing portion, drying processing portion, and exposure processing portion, when the conveying speed of the substrate P is temporarily different, for example, the storage devices BF1 and BF2 provided as illustrated in FIG. 3 in the position of the drying processing portion (processing device 112 and the like). In other words, the first storage device BF1 and the second storage device BF2 is provided before and after the processing unit PU1, and one storage device having a configuration similar to the first storage device BF1 (second storage device BF2) is provided between the rotation drum DR1 and the rotation drum DR2. Furthermore, the first storage device BF1 may be provided between the rotation drum DR1 and the rotation drum DR2, and the second storage device BF2 may be provided between the rotation drum DR2 and the processing device PR4. Furthermore, the first storage device BF1 may be provided between the processing device PR1 and the rotation drum DR1, and the second storage device BF2 may be provided between the rotation drum DR1 and the rotation drum DR2.

What is claimed is:

1. A device manufacturing method for conveying a long, flexible sheet substrate along a length direction while forming a pattern for an electronic device on the sheet substrate sequentially along the length direction, comprising:
   a conveying step for conveying the sheet substrate at a predetermined speed along the length direction through a first processing step and a second processing step, in that order, to implement mutually differing processes relating to the sheet substrate;
   depositing a coating layer selectively or uniformly on the surface of the sheet substrate under first pre-set processing conditions in the first processing step;
   causing the pattern to appear on the sheet substrate by implementing removing processing for removing one of either reformed portions or non-reformed portions created on the coating layer corresponding to the pattern under second pre-set processing conditions in the second processing step, or precipitating processing for precipitating a material for electronic devices on one of either the reformed portions or the non-reformed portions; and
   a determining step for determining the possibility of changing at least one of the conditions of the first processing conditions or the second processing conditions, and the possibility of changing the conveying speed of the sheet substrate of at least one of the first processing step or the second processing step according to the pattern appearing on the sheet substrate during the second processing step exhibiting a tendency to fluctuate from predetermined target shape or dimensions.

2. The device manufacturing method according to claim 1, wherein a storage length of the sheet substrate in the length direction is determined based on a difference between a speed at which the sheet substrate is conveyed in the first processing step and a speed at which the sheet substrate is conveyed in the second processing step and an entire length of the sheet substrate sequentially processed in the first processing step and the second processing step, and wherein in the conveying step, the storage length is stored in a storage device provided between the first processing step and the second processing step.

3. The device manufacturing method according to claim 2, wherein in the conveying step, throughout the entire length of the sheet substrate sequentially processed in the first processing step and the second processing step, the speed at which the sheet substrate is conveyed in the first processing step is kept constant and the speed at which the sheet substrate is conveyed in the second processing step is kept constant.

4. The device manufacturing method according to claim 1, wherein the coating layer is a photosensitive functional layer which is reformable in receipt of energy rays, and
the second processing step comprises creating the reformed portions and the non-reformed portions corresponding to the pattern on the photosensitive functional layer by irradiating the photosensitive functional layer deposited on the surface of the sheet substrate with the energy rays corresponding to the pattern.

5. The device manufacturing method according to claim 4, wherein the photosensitive functional layer is one of photoresist reformed corresponding to the pattern by irradiation of ultraviolet rays as the energy rays, a photosensitive silane coupling agent reformed in hydrophilic and hydrophobic properties corresponding to the pattern by the irradiation of the ultraviolet rays, and a photosensitive reducing agent reformed so as to expose a plating reduction group.

6. The device manufacturing method according to claim 5, wherein the second processing step implements removing processing in a case where the photosensitive functional layer is photoresist, and precipitating processing in a case where the photosensitive functional layer is the photosensitive silane coupling agent or the photosensitive reducing agent.

7. The device manufacturing method according to claim 1, wherein the determining step measures the shape and dimensions of the pattern actually appeared on the sheet substrate by the second processing step, and determines whether errors in the measured shape and dimensions have the tendency of fluctuation exceeding an acceptable range set as a target.

8. A device manufacturing method for conveying a long, flexible sheet substrate along a length direction while forming a pattern for an electronic device on the sheet substrate sequentially along the length direction, comprising:
a conveying step for conveying the sheet substrate at a predetermined speed along the length direction through a first processing step and a second processing step, in that order, to implement mutually differing processes relating to the sheet substrate;
depositing a coating layer selectively or uniformly on the surface of the sheet substrate and creating a reformed portion and a non-reformed portion corresponding to the pattern on the coating layer under first pre-set processing conditions in the first processing step,
causing the pattern to appear on the sheet substrate by implementing removing processing for removing one of either the reformed portions or the non-reformed portions of the coating layer, or precipitating processing for precipitating a material for electronic devices on one of either the reformed portions or the non-reformed portions under second pre-set processing conditions in the second processing step; and
a determining step for determining the possibility of changing at least one of the conditions of the first processing conditions or the second processing conditions, and the possibility of changing the conveying speed of the sheet substrate of at least one of the first processing step or the second processing step, according to the pattern appearing on the sheet substrate during the second processing step exhibiting a tendency to fluctuate from predetermined target shape or dimensions.

9. The device manufacturing method according to claim 8, wherein a storage length of the sheet substrate in the length direction is determined based on a difference between a speed at which the sheet substrate is conveyed in the first processing step and a speed at which the sheet substrate is conveyed in the second processing step and an entire length of the sheet substrate sequentially processed in the first processing step and the second processing step, and
wherein in the conveying step, the storage length is stored in a storage device provided between the first processing step and the second processing step.

10. The device manufacturing method according to claim 9, wherein in the conveying step, throughout the entire length of the sheet substrate sequentially processed in the first processing step and the second processing step, the speed at which the sheet substrate is conveyed in the first processing step is kept constant and the speed at which the sheet substrate is conveyed in the second processing step is kept constant.

11. The device manufacturing method according to claim 8, wherein the coating layer is a photosensitive functional layer which is reformable in receipt of energy rays,
the first processing step comprises:
a depositing step for selectively or uniformly depositing the photosensitive functional layer having a thickness set under the first processing conditions on the surface of the sheet substrate, and
a reforming step for creating the reformed portion and the non-reformed portion corresponding to the pattern on the photosensitive functional layer by irradiating the photosensitive functional layer with energy rays corresponding to the pattern.

12. The device manufacturing method according to claim 11, wherein the photosensitive functional layer is one of photoresist reformed corresponding to the pattern by irradiation of ultraviolet rays as the energy rays, a photosensitive silane coupling agent reformed in hydrophilic and hydrophobic properties corresponding to the pattern by the irradiation of the ultraviolet rays, and a photosensitive reducing agent reformed so as to expose a plating reduction group.

13. The device manufacturing method according to claim 12, wherein the second processing step implements removing processing in a case where the photosensitive functional layer is photoresist, and precipitating processing in a case where the photosensitive functional layer is the photosensitive silane coupling agent or the photosensitive reducing agent.

14. The device manufacturing method according to claim 8, wherein the determining step measures the shape and dimensions of the pattern actually appeared on the sheet substrate by the second processing step, and determines whether errors in the measured shape and dimensions have the tendency of fluctuation exceeding an acceptable range set as a target.

* * * * *